US011073697B1

(12) United States Patent
Sharma et al.

(10) Patent No.: US 11,073,697 B1
(45) Date of Patent: Jul. 27, 2021

(54) SWITCHABLE ELECTROACTIVE DEVICES FOR HEAD-MOUNTED DISPLAYS

(71) Applicant: Facebook Technologies, LLC, Menlo Park, CA (US)

(72) Inventors: Robin Sharma, Redmond, WA (US); Andrew John Ouderkirk, Redmond, WA (US); Tanya Malhotra, Redmond, WA (US); Kenneth Diest, Kirkland, WA (US); Gregory Olegovic Andreev, Redmond, WA (US); Erik Shipton, Kenmore, WA (US); Christopher Yuan Ting Liao, Seattle, WA (US); Barry David Silverstein, Kirkland, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/351,477

(22) Filed: Mar. 12, 2019

Related U.S. Application Data

(60) Provisional application No. 62/777,825, filed on Dec. 11, 2018.

(51) Int. Cl.
*G02B 27/01* (2006.01)
*G02C 7/08* (2006.01)
(Continued)

(52) U.S. Cl.
CPC ......... *G02B 27/0172* (2013.01); *G02C 7/083* (2013.01); *G06K 9/00671* (2013.01); *G06T 19/006* (2013.01)

(58) Field of Classification Search
CPC .............. G02B 27/0172; G02B 27/017; G02B 2027/0178; G02F 1/0128; G02F 1/19; G02F 1/0131
See application file for complete search history.

(56) References Cited

U.S. PATENT DOCUMENTS 5,095,515 A    3/1992  Seaver
6,420,441 B1   7/2002  Allen et al.
(Continued)

OTHER PUBLICATIONS

Mullin et al., "Pattern Transformation Triggered by Deformation", Physical Review Letters, vol. 99, No. 8, 2007, 4 pages.
(Continued)

*Primary Examiner* — William Lu
(74) *Attorney, Agent, or Firm* — FisherBroyles, LLP

(57) ABSTRACT

Embodiments of the disclosure are generally directed to systems and methods for switchable electroactive devices for head-mounted displays (HMDs). In particular, a method may include (1) applying an electric field to an electroactive element of an electroactive device via electrodes of the electroactive device that are electrically coupled to the electroactive element to compress the electroactive element, which comprises a polymer material defining nanovoids, such that an average size of the nanovoids is decreased and a density of the nanovoids is increased in the electroactive element, wherein the electroactive device is positioned at a distance from a user's eye, and (2) emitting image light from an emissive device positioned such that at least a portion of the image light is incident on a surface of the electroactive device facing the user's eye.

20 Claims, 12 Drawing Sheets

(51) Int. Cl.
  *G06T 19/00* (2011.01)
  *G06K 9/00* (2006.01)

(56) References Cited

U.S. PATENT DOCUMENTS

| | | | |
|---|---|---|---|
| 6,628,850 B1 | 9/2003 | Yao | |
| 7,230,771 B2 | 6/2007 | Kuiper et al. | |
| 8,477,402 B2* | 7/2013 | Duncan | G02B 1/005 |
| | | | 359/291 |
| 8,848,280 B2 | 9/2014 | Arsenault | |
| 9,228,822 B2 | 1/2016 | Majidi et al. | |
| 10,670,782 B2 | 6/2020 | Arbabi et al. | |
| 10,690,946 B2 | 6/2020 | Wilson | |
| 10,749,448 B2 | 8/2020 | Lindsay et al. | |
| 2002/0009251 A1 | 1/2002 | Byrne | |
| 2002/0135863 A1* | 9/2002 | Fukshima | G02F 1/292 |
| | | | 359/298 |
| 2002/0186928 A1 | 12/2002 | Curtis | |
| 2005/0196552 A1 | 9/2005 | Lehmann et al. | |
| 2006/0024976 A1 | 2/2006 | Waldfried et al. | |
| 2006/0028734 A1 | 2/2006 | Kuiper et al. | |
| 2007/0020404 A1 | 1/2007 | Seiberle et al. | |
| 2007/0263963 A1 | 11/2007 | Hughes et al. | |
| 2008/0137031 A1* | 6/2008 | Hillis | G02C 7/081 |
| | | | 351/159.67 |
| 2008/0171431 A1 | 7/2008 | Yu et al. | |
| 2008/0197518 A1 | 8/2008 | Aylward et al. | |
| 2008/0224103 A1* | 9/2008 | Arsenault | G02F 1/21 |
| | | | 252/519.2 |
| 2009/0034051 A1* | 2/2009 | Arsenault | G02B 6/1225 |
| | | | 359/290 |
| 2009/0296188 A1 | 12/2009 | Jain et al. | |
| 2010/0075056 A1 | 3/2010 | Axisa et al. | |
| 2011/0149410 A1* | 6/2011 | Blum | G02B 3/14 |
| | | | 359/666 |
| 2011/0242638 A1 | 10/2011 | Horning et al. | |
| 2012/0019185 A1 | 1/2012 | Guidarelli et al. | |
| 2012/0029416 A1 | 2/2012 | Parker et al. | |
| 2012/0200931 A1 | 8/2012 | Haag et al. | |
| 2012/0298200 A1 | 11/2012 | Niggemann et al. | |
| 2013/0202867 A1 | 8/2013 | Coggio et al. | |
| 2013/0222881 A1 | 8/2013 | Aizenberg et al. | |
| 2013/0279151 A1 | 10/2013 | Ouderkirk et al. | |
| 2013/0335807 A1* | 12/2013 | Arsenault | G02F 1/0128 |
| | | | 359/291 |
| 2014/0133010 A1* | 5/2014 | Han | G02F 1/0131 |
| | | | 359/296 |
| 2014/0204372 A1* | 7/2014 | Pang | G01N 21/658 |
| | | | 356/301 |
| 2014/0217539 A1 | 8/2014 | Rantala | |
| 2014/0234995 A1 | 8/2014 | Li et al. | |
| 2014/0266647 A1 | 9/2014 | Visitacion et al. | |
| 2015/0109657 A1 | 4/2015 | Baumberg et al. | |
| 2015/0205126 A1* | 7/2015 | Schowengerdt | G02B 6/02042 |
| | | | 345/633 |
| 2015/0241698 A1 | 8/2015 | Schowengerdt | |
| 2015/0315012 A1* | 11/2015 | Wiersma | F03G 6/00 |
| | | | 349/24 |
| 2016/0103341 A1 | 4/2016 | Long et al. | |
| 2016/0187985 A1 | 6/2016 | Lim et al. | |
| 2016/0283773 A1 | 9/2016 | Popovich et al. | |
| 2017/0023807 A1 | 1/2017 | Chang-Hasnain et al. | |
| 2017/0031078 A1 | 2/2017 | Thompson et al. | |
| 2017/0090570 A1 | 3/2017 | Rain et al. | |
| 2017/0192595 A1 | 7/2017 | Choi et al. | |
| 2017/0285348 A1 | 10/2017 | Ayres et al. | |
| 2017/0365630 A1 | 12/2017 | Yang | |
| 2018/0093456 A1 | 4/2018 | Van Overmeere et al. | |
| 2018/0164627 A1 | 6/2018 | Oh | |
| 2018/0356303 A1 | 12/2018 | Li et al. | |
| 2019/0296218 A1 | 9/2019 | Ouderkirk et al. | |
| 2019/0361318 A1 | 11/2019 | Johnson et al. | |
| 2020/0076328 A1 | 3/2020 | Cha et al. | |
| 2020/0183168 A1* | 6/2020 | Spann | G02F 1/0102 |
| 2020/0183199 A1 | 6/2020 | Diest et al. | |
| 2020/0183200 A1 | 6/2020 | Diest et al. | |
| 2020/0185590 A1 | 6/2020 | Malhotra et al. | |

OTHER PUBLICATIONS

Babaee et al., "3D Soft Metamaterials with Negative Poisson's ratio", Advanced Materials, vol. 25, No. 36, 2013, 18 pages.
Bertoldi et al., "Novel negative Poisson's ratio behavior induced by an elastic instability", Advanced Materials, vol. 22, No. 3, 2010, pp. 1-11.
Overvelde et al., "Relating pore shape to the non-linear response of periodic elastomeric structures", Journal of the Mechanics and Physics of Solids, vol. 64, 2014, 16 pages.
Shen et al., "Simple cubic three-dimensional auxetic metamaterials", Physic. Status Solidi (B), vol. 251, No. 8, 2014, pp. 1515-1522.
Correa et al., "Negative Stiffness Honeycombs for Recoverable Shock Isolation", Rapid Prototyping Journal, vol. 21, No. 2, 2015, pp. 702-713.
Coulais et al., "Discontinuous Buckling of Wide Beams and Metabeams", Physical Review Letters, vol. 115, 2015, 7 pages.
Bickel et al., "Design and Fabrication of Materials with Desired Deformation Behavior", ACM Transactions on Graphics (TOG), vol. 29, No. 4, Jul. 2010, 10 pages.
Rosset et al., "Small, fast, and tough: Shrinking down integrated elastomer transducers", Applied Physics Reviews, vol. 3, No. 3, 2016, pp. 1-27.
Plante et al., "Large-scale failure modes of dielectric elastomer actuators", International Journal of Solids and Structures, vol. 43, 2006, pp. 7727-7751.
"Optotune DEAPs", Electroactive polymers, URL: https://www.optotune.com/technology/electroactive-polymers, 2019, 3 pages.
Product—Novasentis, "EMP Haptic Actuators for Sensory Innovation", URL: https://www.novasentis.com/product, 2019, 4 pages.
Rosset et al., "Mechanical characterization of a dielectric elastomer microactuator with ion-implanted electrodes", Sensor and Actuators A 144, 2008, 25 pages.
Gerratt et al., "Dielectric breakdown of PDMS thin films", Journal of Micromechanics and Microengineering, vol. 23, Apr. 26, 2013, 8 pages.
Hunt et al., "A self-healing dielectric elastomer actuator", Applied Physics Letters, vol. 104, 2014, 4 pages.
Skov et al., "Optimization Techniques for Improving the Performance of Silicone-Based Dielectric Elastomers", Advanced Engineering Materials, vol. 20, 2018, pp. 1-21.
Mazurek et al., "Glycerol as high-permittivity liquid tiller in dielectric silicone elastomers", Journal of Applied Polymer Science, vol. 133, No. 43, 2016, 28 pages.
Rao et al., "Synthesis of flexible silica aerogels using methyltrimethoxysilane (MTMS) precursor", Journal of Colloid and Interface Science, vol. 300, 2006, pp. 279-285.
Seo et al., "Reticulated Nanoporous Polymers by Controlled Polymerization-Induced Microphase Separation", Science, vol. 336, Jun. 15, 2012, 5 pages.
Jennings, S.G., "The mean free path in air", Journal of Aerosol Science, vol. 19, No. 2, 1988, pp. 1-2.
Gupta et al., "Nanoemulsions: formation, properties and applications", Soft Matter, 2016, 16 pages.
Helgeson et al., "Mesoporous organohydrogels from thermogelling photocrosslinkable nanoemulsions", Nature Materials, vol. 11, Apr. 2012, pp. 344-352.
Guha et al., "Creating nanoscale emulsions using condensation", Nature Communications, vol. 8, No. 1371, Nov. 8, 2017, pp. 1-7.
Meier et al., "Microemulsion elastomers", Colloid Polymer Science, vol. 274, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.

(56) References Cited

OTHER PUBLICATIONS

Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.
Fratzl et al., "The mechanics of tessellations-bioinspired strategies for fracture resistance", Chem Soc Rev., vol. 45, No. 2, Jan. 21, 2016, pp. 252-267.
Gohtani et al., "Nano-Emulsions; Emulsification Using Low Energy Methods", Japan Journal of Food Engineering, vol. 15, No. 3, Sep. 1, 2014, pp. 119-130.
Michler et al., "The physics and micro-mechanics of nano-voids and nano-particles in polymer combinations", ScienceDirect, Polymer, vol. 54, No. 13, Jun. 7, 2013, pp. 1-14.
Zhu et al., "Large deformation and electromechanical instability of a dielectric elastomer tube actuator", Journal of Applied Physics, vol. 108, Issue 7, Article 074113, Oct. 13, 2010, pp. 1-6.
Cameron et al., "Linear actuation in coextruded dielectric elastomer tubes", ScienceDirect, Sensors and Actuators A: Physical, vol. 147, Issue 1, Sep. 15, 2008, pp. 286-291.
Catmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Moore, Duncan T., "Gradient Index Optics", Optical Elements, IVPV Handbook of Optics, 2nd Edition, vol. II—Devices, Measurements, and Properties, 1995, pp. 9.1-9.10.
Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.
Shatz, Narkis, "Gradient-Index Optics", Science Applications International Corp., Final Report, Mar. 31, 2010, 103 pages.
Teichman et al., "Gradient Index Optics at DARPA", Institute for Defense Analyses, IDA Document D-5027, Nov. 2013, 69 pages.
Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.
Matyka et al., "How to Calculate Tortuosity Easily?", AIP Conference Proceedings, Mar. 26, 2012, 6 pages.
Cheng et al., "Controlled in Situ Nanocavitation in Polymeric Materials", Advanced Materials, vol. 23, Jan. 2011, pp. 409-413.
Solans et al., "Nano-emulsions: Formation by low-energy methods", Colloid & Interface Science, vol. 17, Issue 5, Oct. 2012, pp. 246-254.
Fuse et al., "Possible Mechanism of Superior Partial-Discharge Resistance of Polyamide Nanocomposites", Annual Report Conference on Electrical Insulation and Dielectric Phenomena, 2004, pp. 322-325.
Wu et al., "3D Printed Silicones with Shape Memory", Scientific Reports, vol. 7, No. 4664, Jul. 5, 2017, pp. 1-6.
Johnson et al., "A brief review of atomic layer deposition:from fundamentals to applications", Materials Today, vol. 17, No. 5, Jun. 2014, pp. 236-246.
Sole et al., "Nano-emulsions prepared by the phase inversion composition method: Preparation variables and scale up", Journal of Colloid and Interface Science, vol. 344, 2010, pp. 417-423.
Camino et al., "Polydimethylsiloxane thermal degradation Part 1. Kinetic aspects", Polymer, vol. 42, 2001, pp. 2395-2402.
Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.
Waldem et al., "Digilens Switchable Bragg grating waveguide optics for augmented reality applications", Proc. SPIE 10676, Digital optics for Immersive Displays, May 21, 2018, 1 page.
Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.
Diest et al., "Nanovoided Tunable Optics", U.S. Appl. No. 16/262,439, filed Jan. 30, 2019, 57 pages.
Ouderkirk et al., "Nanovoided Graded-Index Optical Elements, Optical Arrays, and Methods of Forming the Same", U.S. Appl. No. 16/426,737, filed May 30, 2019, 113 pages.
Diest et al., "Polymer Materials Including Coated Nanovoids and Methods and Systems for Forming the Same", U.S. Appl. No. 16/512,335, filed Jul. 15, 2019, 133 pages.
International Search Report and Written Opinion received for PCT Application Serial No. PCT/US2019/064367 dated Mar. 11, 2020, 17 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
Diest et al., "Nanovoided Tunable Birefringence", U.S. Appl. No. 16/262,433, filed Jan. 30, 2019, 51 pages.
Malhotra et al., "Spatially Addressable Nanovoided Polymers", U.S. Appl. No. 16/417,911, filed May 21, 2019, 138 pages.
Landig et al., "Fabrication of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable BRAGG GRATINGS", Optics & Photonics News, Apr. 30, 2003, pp. 54-59.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.

(56) References Cited

OTHER PUBLICATIONS

Wegener et al., "Controlled inflation of voids in cellular polymer ferroelectrets: Optimizing electromechanical transducer properties", Applies Physics Letters, vol. 84, No. 3, Jan. 19, 2004, pp. 392-394.

Wu et al., "Fabrication of ultralong perovskite structure nanotubes", RSC Advances, vol. 8, Jan. 2, 2018, pp. 367-373.

Wu et al., "Efficient multi-barrier thin film encapsulation of OLED using alternating Al2O3 and polymer layers", RSC Advances, vol. 8, Feb. 2, 2018, pp. 5721-5727.

Yang et al., "Harnessing Surface Wrinkle Patterns in Soft Matter", Advanced Functional Materials, vol. 20, Jul. 29, 2010, pp. 2550-2564.

Zhang et al., "Highly Porous Polyhedral Silsesquioxane Polymers. Synthesis and Characterization", J. Am. Chem. Soc., vol. 120, Aug. 11, 1998, pp. 8380-8391.

Yang et al., "Avoiding the pull-in instability of a dielectric elastomer film and the potential for increased actuation and energy harvesting", Soft Matter, vol. 13, Jan. 6, 2017, pp. 4552-4558.

Jang et al., "Mechanically Tunable Three-Dimensional Elastomeric Network/Air Structures via Interference Lithography", Nano Letters, vol. 6, No. 4, Mar. 15, 2006, pp. 740-743.

Rogers et al., "Materials and Mechanics for Stretchable Electronics", Science, vol. 327, Mar. 26, 2010, pp. 1603-1607.

Wolak et al., "Dielectric response of structured multilayered polymer films fabricated by forced assembly", Applied Physics Letters, vol. 92, Article 113301, Mar. 17, 2008, pp. 1-3.

Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.

Ieda, Masayuki, "Dielectric Breakdown Process of Polymers", IEEE Transactions on Electrical Insulation, vol. EI-15, No. 3, Jun. 1980, pp. 206-224.

Non-Final Office Action received for U.S. Appl. No. 16/364,977 dated Oct. 19, 2020, 38 pages.

Preinterview first office action received for U.S. Appl. No. 16/262,439 dated Nov. 30, 2020, 42 pages.

Preinterview first office action received for U.S. Appl. No. 16/263,829 dated Dec. 22, 2020, 36 pages.

Non-Final office action received for U.S. Appl. No. 16/449,964 dated Nov. 24, 2020, 91 pages.

Holda et al., "Understanding and guiding the phase inversion process for synthesis of solvent resistant nanofiltration membranes", J. Appl. Polym. Sci. 42130, 2015, 17 pages.

Struzynska-Piron et al., "Synthesis of solvent stable polymeric membranes via UV depth-curing", Chem. Commun., vol. 49, 11494, 2013, 3 pages.

Preinterview first office action received for U.S. Appl. No. 16/262,433 dated Oct. 26, 2020, 58 pages.

U.S. Appl. No. 16/262,439, filed Jan. 30, 2019.

U.S. Appl. No. 16/262,433, filed Jan. 30, 2019.

U.S. Appl. No. 16/262,829, filed Jan. 31, 2019.

Notice of Allowance received for U.S. Appl. No. 16/364,977 dated Feb. 2, 2021, 40 pages.

Notice of Allowance received for U.S. Appl. No. 16/263,829 dated Feb. 4, 2021, 27 pages.

Notice of Allowance received for U.S. Appl. No. 16/449,964 dated Mar. 4, 2021, 21 pages.

First Action Interview received for U.S. Appl. No. 16/262,433 dated Mar. 1, 2021, 12 pages.

Notice of Allowance received for U.S. Appl. No. 16/262,439 dated Apr. 6, 2021, 38 pages.

\* cited by examiner

SWITCHABLE ELECTROACTIVE DEVICES FOR HEAD-MOUNTED DISPLAYS

CROSS REFERENCE TO RELATED APPLICATION

This application is a non-provisional utility application which claims the benefit of U.S. Provisional Application No. 62/777,825 filed 11 Dec. 2018, the disclosure of which is incorporated, in its entirety, by this reference.

BACKGROUND

Projector screens include a surface such as a screen used for displaying projected images and may often be composed of fabric or paints that contain granular structures. In some respects, the greater the graininess of the screen, the more diffusely and uniformly the screen may scatter light. In the field of optics, an ideal diffusely scattering surface may be referred to as a Lambertian diffuser. In particular, a Lambertian diffuser may have the property of being able to distribute incident light equally over a $2\pi$ solid angle. This property may be useful for projector screens, which may be used in home theaters or movie theaters, at least because such projector screens may have large viewing angle. However, conventional projector screens are not necessarily switchable between a transparent state and a reflecting state. Moreover, such projector screens are often used in large-scale settings, for example, in a home or building, and are not typically used in the context of wearable devices.

SUMMARY

As will be described in greater detail below, the instant disclosure describes switchable electroactive devices which may be used in head-mounted displays (HMDs). In one embodiment, a display device is described, the display device including an electroactive device positioned to be located at a distance from a user's eye when the display device is worn by the user. Further, the electroactive device may include (1) an electroactive element including an electroactive element that includes a polymer material defining nanovoids and (2) electrodes electrically coupled to the electroactive element and configured to apply an electric field to the electroactive element, wherein the electroactive element is compressible from an uncompressed state to a compressed state by the application of the electric field so as to decrease an average size of the nanovoids and increase a density of the nanovoids in the compressed state. Moreover, an emissive device positioned to radiate image light onto a surface of the electroactive device facing the user's eye. The emissive device may be an ultra-short throw projector.

In some examples, the electroactive device may be substantially opaque in the uncompressed state. Further, the electroactive device may be transparent in the compressed state. In the uncompressed state of the electroactive element, the nanovoids have a first average size on an order of a wavelength of incident light. In the uncompressed state of the electroactive element, the nanovoids may have a first average size on an order of a wavelength of incident light. Additionally, in the compressed state of the electroactive element, the nanovoids have a second average size that is substantially smaller than the wavelength of the incident light. In the compressed state of the electroactive element, the nanovoids may have a second average size that is substantially smaller than the wavelength of the incident light.

In some examples, the display system may further include an eyepiece positioned between the user's eye and the electroactive device. The eyepiece may be configured to modify a focus of the user's eye to a focal plane of the electroactive device in an active state of the eyepiece. The active state of the eyepiece may be used in a virtual reality application. Further, the inactive state of the eyepiece may be used in an augmented reality application or a mixed reality application.

In one example, the eyepiece may include a proximate eyepiece and the display device may further include a distal eyepiece positioned near a surface of the electroactive device opposite the proximate eyepiece. In one example, a degree of scattering of incident light by the electroactive element may be based, at least in part, on at least one of the density or the average size of the nanovoids.

In another embodiment, a display device is described. The display system may include an electroactive device including an electroactive element and electrodes electrically coupled to the electroactive element. Additionally, the display system may include a waveguide display positioned to be located between the user's eye and the electroactive device when the display device is worn by the user, the waveguide display configured to transmit image light to the user's eye. In some examples, the waveguide display may be configured to operate with a light source. The light source may include at least one of a micro light-emitting diode, a light emitting diode, an organic light-emitting diode, or a laser.

A corresponding method is also described. The method may include applying an electric field to an electroactive element of an electroactive device via electrodes of the electroactive device that are electrically coupled to the electroactive element to compress the electroactive element, which includes a polymer material defining nanovoids, from an uncompressed state to a compressed state such that an average size of the nanovoids is decreased and a density of the nanovoids is increased in the electroactive element. The electroactive device may be positioned at a distance from a user's eye. The method may further include emitting image light from an emissive device positioned such that at least a portion of the image light is incident on a surface of the electroactive device facing the user's eye. In some embodiments, the method may additionally include reducing the magnitude of the electric field applied to the electroactive element of an electroactive device to expand the electroactive element from the compressed state to the uncompressed state such that the average size of the nanovoids is increased and the density of the nanovoids is decreased in the electroactive element Features from any of the these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
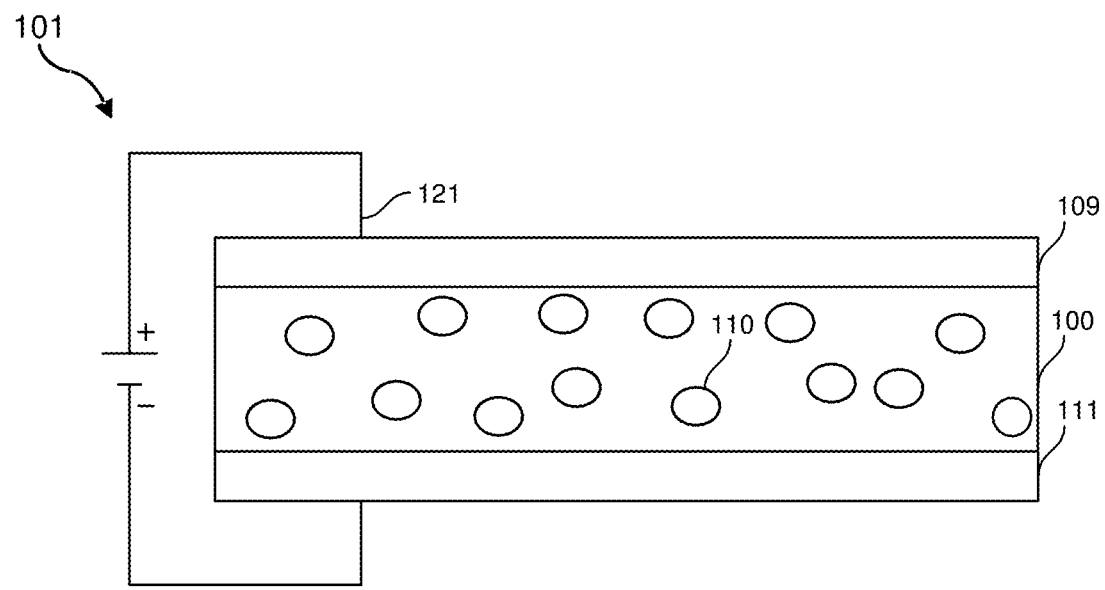
FIGS. 1A-1D are illustrations of exemplary switchable electroactive devices in uncompressed and compressed states, which may be used to selectively display images to a user's eye.

Throughout the drawings, identical reference characters and/or descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Embodiments of the disclosure are generally directed to electroactive devices and optical systems that selectively relay light from a display to a user's eye. In some conventional virtual-reality HMDs, light emitted by a display placed in proximity to the user's eye may be transmitted to the eye by an eyepiece. Accordingly, the display may be positioned at an optical plane that is conjugate to the location of the user's eye. The display may include a liquid crystal (LCD) display, a light-emitting diode (LED) display, a microLED display, an organic light-emitting diode (OLED) display, a waveguide display, a liquid crystal on silicon (LCOS) display, and/or the like. In contrast, the disclosed systems may include configurations where a display may project light onto a switchable electroactive device serving as a screen that may selectively reflect a portion of the light to a user's eye.

The switchable electroactive devices may selectively reflect incident light via electroactive elements that may have adjustable optical properties based on an applied electric field. The electroactive elements may include electroactive materials (e.g., electroactive polymers, EAPs) having nanovoids, to be discussed further below. Further, the electroactive elements may be sandwiched by electrodes to form the electroactive device. The transparency or opacity of a nanovoided electroactive element may be controlled through the application of a voltage across the electrodes. This application of voltage may modify the volume of the nanovoided electroactive element and thus the average size and density of the nanovoids in the electroactive element. In some examples, the electroactive element may have random or regularly dispersed nanovoids.

The nanovoided electroactive element may exhibit differential Raleigh scattering, for example, based on the average size, density, and/or distribution of the nanovoids. As will be further described below, Raleigh scattering may represent an underlying physical mechanism for the change in a transparency of an electroactive element upon the application of a voltage.

Certain embodiments describe system architectures where light may be radiated by a projector onto a switchable electroactive device that is placed at an optical plane that is conjugate to the retina of the user's eye. As noted, in some examples, the disclosed systems may control the transmissivity, transparency, and/or reflectivity of the electroactive element in the switchable electroactive device. For example, the disclosed systems may apply an electric voltage to the electroactive element by the electrodes of the electroactive device. This may allow the electroactive device to be selectively turned on to serve as a display in one configuration, and to be turned off in another configuration to serve as a transparent device.

The disclosed systems may be used in connection with conventional displays including, but not limited to, an LCD display, an LED display, a microLED display, an OLED display, a waveguide-based display, a LCOS display, and/or the like, which are typically not transparent. By projecting light onto the switchable electroactive device from an off-axis projector (e.g., an ultra-short-throw projector), the disclosed systems may be used for mixed-reality, augmented-reality, and/or virtual-reality applications (collectively referred to as "artificial reality" herein). The applicability of the disclosed systems described herein for artificial reality applications may be determined at least in part by various design parameters of the display and/or the electroactive devices including, but not limited to, the switching speeds, power requirements, translucency, and/or the like.

In some examples, the projector may include an ultra-short-throw projector positioned with respect to the switchable electroactive device. The ultra-short-throw projector and the electroactive device may be configured in a HMD such that the HMD may selectively display artificial reality content. Alternatively, a waveguide display or similar device may be used in conjunction with the switchable electroactive device in the HMD such that the HMD may selectively display artificial reality content. In particular, the switchable electroactive device may serve as an optical filter that may be selectively turned on and off to allow for ambient light to enter the eyepiece of the HMD and toward the user's eye. As such, the switching speed of the electroactive device may represent a design parameter of the HMD or similar device.

Figure 1B:
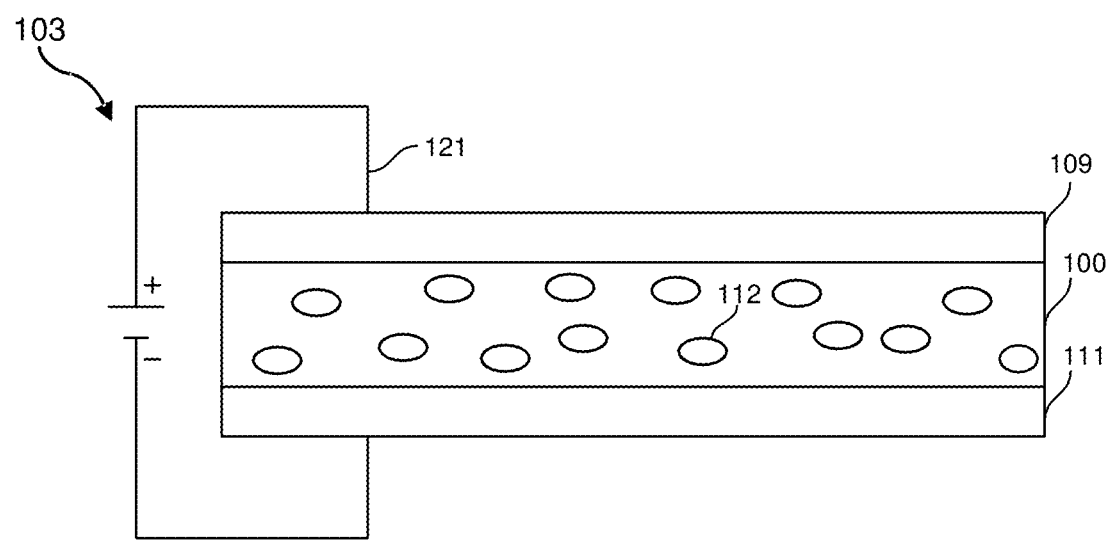

FIGS. 1A and 1B illustrate exemplary diagrams demonstrating a switchable electroactive device (e.g., a screen) in a uncompressed state and in a compressed state, respectively. In particular, the electroactive device of FIGS. 1A and 1B may be configured to be opaque in an uncompressed state of the electroactive element 100, and the electroactive device may be configured to be transparent in a compressed state of the electroactive element 100.

As shown in diagram 101, the electroactive element 100 (e.g., an EAP) may include nanovoids 110. For example, as will be described in greater detail below, electroactive element 100 may include a polymer material (e.g., an elastomeric polymer) defining a plurality of nanovoids 110. Further, the electroactive device may include electrodes 109 and 111 electrically coupled to the electroactive element 100 and configured to apply an electric field to the electroactive element 100. Electrodes 109 and 111 may include any suitable electrically conductive material, such as, for example, an optically transparent material (e.g., a transparent conducting film including a transparent conductive oxide such as indium tin oxide, fluorine doped tin oxide, and/or doped zinc oxide, a conductive polymer such as a polyacetylene, polyaniline, polypyrrole, and/or polythiophene derivative, carbon nanotubes, and/or graphene). Moreover, a voltage may be applied to the electroactive element 100 using a circuit 121 that generates an electric field across the electroactive element 100. In some examples, the electroactive element 100 may be compressible by an application of the electric field which decreases the nanovoids' average size and increases a density of nanovoids in the electroactive element 100.

Diagram 101 shows the electroactive element 100 in an uncompressed state in which the circuit 121 of the electroactive device applies no voltage or a relatively low voltage across the electroactive element 100 via electrodes 109 and 111. Accordingly, the nanovoids 110 may be larger in size with respect to a compressed state and may therefore scatter incident light. As noted, the uncompressed state of the electroactive element 100 (FIG. 1A) may correspond to the nanovoids having a size on the order of a wavelength of the light, and the compressed state of the electroactive element 100 (FIG. 1B) may correspond to the nanovoids having a size that is substantially smaller than the wavelength of the light. For example, electroactive element 100 may scatter light having wavelengths in the visible spectrum (i.e., about 380 to about 740 nm) or at least a portion thereof. Moreover, the degree of scattering of incident light by the electroactive element may be based, at least in part, on the density or the average size of the nanovoids. In some examples, the size of the nanovoids may range from about 0.1 nm to about 1000 nm. Further, the size range for the nanovoids (e.g., the polydispersity of the nanovoids) may vary by a factor of about five or more (i.e., the nanovoids may exhibit a diameter change of 5X or more) between the compressed and uncompressed states (e.g., the size range for the nanovoids between the compressed and uncompressed states may vary by a factor of between approximately 2 to approximately 20 or more). In some examples, the shape of the nanovoids in the electroactive element may include any suitable shape including, but not limited to, spheroid shapes, ellipsoid shapes, disk-like shapes, and/or irregular shapes, and the nanovoid shapes may change between the compressed and uncompressed states.

In some examples, the electroactive device may include a single pair of electrodes, such as electrodes 109 and 111, or multiple pairs of electrodes (not shown) which may be patterned across a region of an electroactive element (e.g., similar to electroactive element 100). In particular, the region of the electroactive element may correspond to an aperture associated with the electroactive device as used in an HMD. This may be done in order to create spatially controllable light scattering (e.g., scattering that is implemented with differing magnitudes at different regions of the electroactive element). Such spatially controllable scattering may serve to increase the dynamic range of projected images scattered by the electroactive device. Further, while electrodes may serve to impart an electric field onto the electroactive element and modify the electroactive device properties as described herein, in other examples, the electroactive device may be switched with at least a partially non-electrical technique. In particular, the electroactive device may be switched based on a mechanical compression of the electroactive element or may be switched using acoustic waves that may propagate through the electroactive element.

Turning now to FIG. 1B, diagram 103 represents the electroactive element 100 of the electroactive device shown FIG. 1A in a compressed state. In particular, the circuit 121 of the electroactive device may apply an increased voltage across the electroactive element 100 via electrodes 109 and 111. Accordingly, the disclosed systems may apply an electric field (not shown) between the electrodes 109 and 111 of the electroactive device. This may lead to the compression of the nanovoids 112 as compared with their uncompressed state (shown and described in connection with FIG. 1A, above). The magnitude of the electric field may be configured to modify the extent of the compression of the nanovoids 112. For example, the magnitude may be configured to reduce the size of the nanovoids 112 to be relatively smaller than the wavelength of incident light on the electroactive element 100 (e.g., smaller than wavelengths of light in the visible spectrum or at least a portion thereof), causing the electroactive element 100 to become relatively transparent, thus allowing the incident light to propagate through the electroactive element 100.

As the nanovoids are compressed, the size of the nanovoids 112 may become several orders of magnitude smaller than wavelengths of light incident on the electroactive element 100. In this case, the amount of light scattered from the electroactive element 100 due to the nanovoids 112 may be minimized during compression. Further, the interaction of electromagnetic fields with nanovoids 112 having a size that is substantially smaller than wavelengths of incident light may lead to Rayleigh scattering of the incident light from the nanovoids 112. As the size of the nanovoids 112 in the electroactive element 100 increases, the amount of scattered light from the electroactive element 100 may also increase. If the nanovoids 112 are in the same or substantially the same size range as wavelengths of incident light, a Mie scattering mechanism may describe the scattering of the light from the nanovoids 112.

In some examples, when there is little or no electric field applied to the electroactive element 100 by the electrodes 109 and 111, the size of the nanovoids 112 may be less than about 1000 nm and greater than about 400 nm. As noted, the application of electric field across the electroactive element may result in a mechanical compression of the electroactive element 100 from a prior uncompressed state. The magnitude of electric fields across the electrodes 109 and 111 can selected to change the size and density of the nanovoids 112 to achieve a desired amount of in transparency between the compressed and uncompressed states. In a compressed state, the nanovoids 112 of the electroactive element 100 may be reduced, in the compressed state, to sizes of from about 0.1 nm to about 50 nm based on the magnitude of the applied electrical field.

Figure 1C:
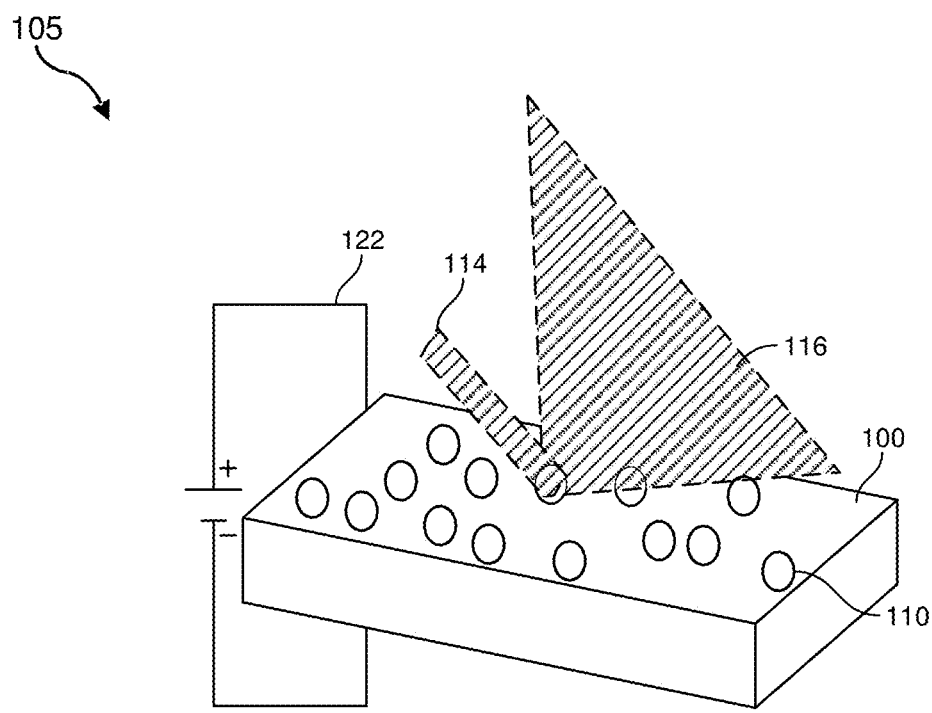
Figure 1D:
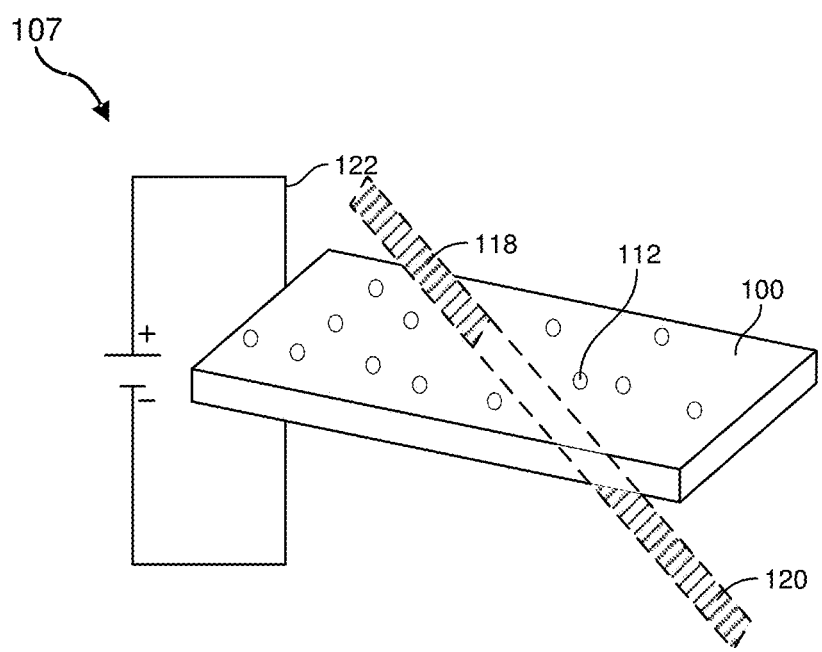

FIGS. 1C and 1D illustrate exemplary diagrams 105 and 107 demonstrating an example of a switchable electroactive device in a uncompressed state and a compressed state, respectively. In particular, diagram 105 shows incident light 114 scattering off the electroactive element 100 in the uncompressed state to produce scattered light 116 via a Rayleigh scattering mechanism. As noted, this scattering may be due to the fact that the nanovoids 110 may have a size that is on the order of the wavelength of incident light when a voltage applied by a circuit 122 (e.g., via opposed electrodes, such as electrodes 109 and 111 in FIGS. 1A and 1B) is below a predetermined threshold. Further, the fraction of the incident light 114 may be scattered because the size of the nanovoids 110 is within about 0.1 to about 10 times the wavelength of the incident light 114. In one example, the fraction of scattered light 116 can be anywhere from greater than about 95% to less than about 5% of the incident light 114 on the electroactive device.

Diagram 107 of FIG. 1D shows a compressed state of the electroactive device shown in FIG. 1C. In particular, incident light 118 may be transmitted through the electroactive element 100 to produce transmitted light 120 when the nanovoids 112 are compressed to be much smaller than the wavelength of incident light 118. As noted, the nanovoids 112 may be compressed when an electric field is applied to the electroactive element 100 as a result of a voltage applied by the circuit 122.

In particular, if a beam of visible wavelength light (e.g., incident light 118) is directed towards the electroactive device when the electroactive element 100 is in a compressed state, the electroactive element 100 may scatter relatively little light because the size of the nanovoids 112 may be much smaller than the wavelength of light. Accordingly, the electroactive device may be transparent in the visible portion of the electromagnetic spectrum. In another embodiment, by modulating the electrical field applied across the electroactive element 100 as a function of time, the electroactive device can serve as a switchable component, such as, for example, a switchable screen, a time-varying beam-block, and/or a time-varying intensity modulator for light in the visible and near-infrared portion of the electromagnetic spectrum. Further, as described in connection with FIGS. 5-8 below, if the electroactive device is placed in the vicinity of a user's eye in an HMD and a projector is positioned at a suitable location (e.g., an off-axis location) with respect to the electroactive device, a system including such components can serve as a near-eye artificial reality-based HMD.

Figure 2A:
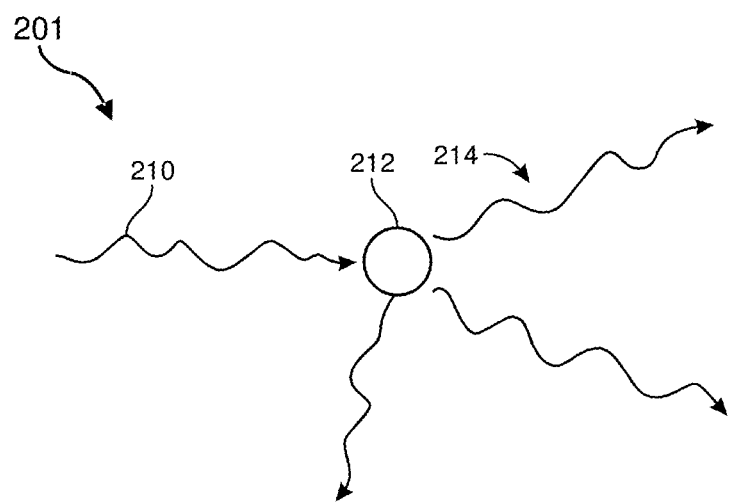
FIG. 2A illustrates an example diagram demonstrating Rayleigh scattering by particles (e.g., nanovoids) that are smaller than the wavelength of incident light, which may be used to explain why the switchable electroactive device can reflect or transmit light in an uncompressed or compressed state, respectively.

FIG. 2A illustrates an exemplary diagram 201 demonstrating an example of Rayleigh scattering by particles having particle sizes (i.e., average diameters) that are smaller than the wavelength of incident light. As used with respect to Rayleigh scattering, particles may refer to the nanovoids in various electroactive elements described herein. As noted, Rayleigh scattering may explain why nanoparticles of a certain size may scatter incident light in an electroactive element. In particular, incident light 210 may interact with a particle 212 (e.g., a nanovoid 110 in an electroactive element 100 as shown and described above in connection with FIG. 1A) and may generate scattered light 214 via a Rayleigh scattering mechanism. As used herein, Rayleigh scattering may refer to a predominantly elastic scattering (i.e., without a change in photon energy) of electromagnetic radiation, such as light, by particles much smaller than the wavelength of the radiation.

Figure 2B:
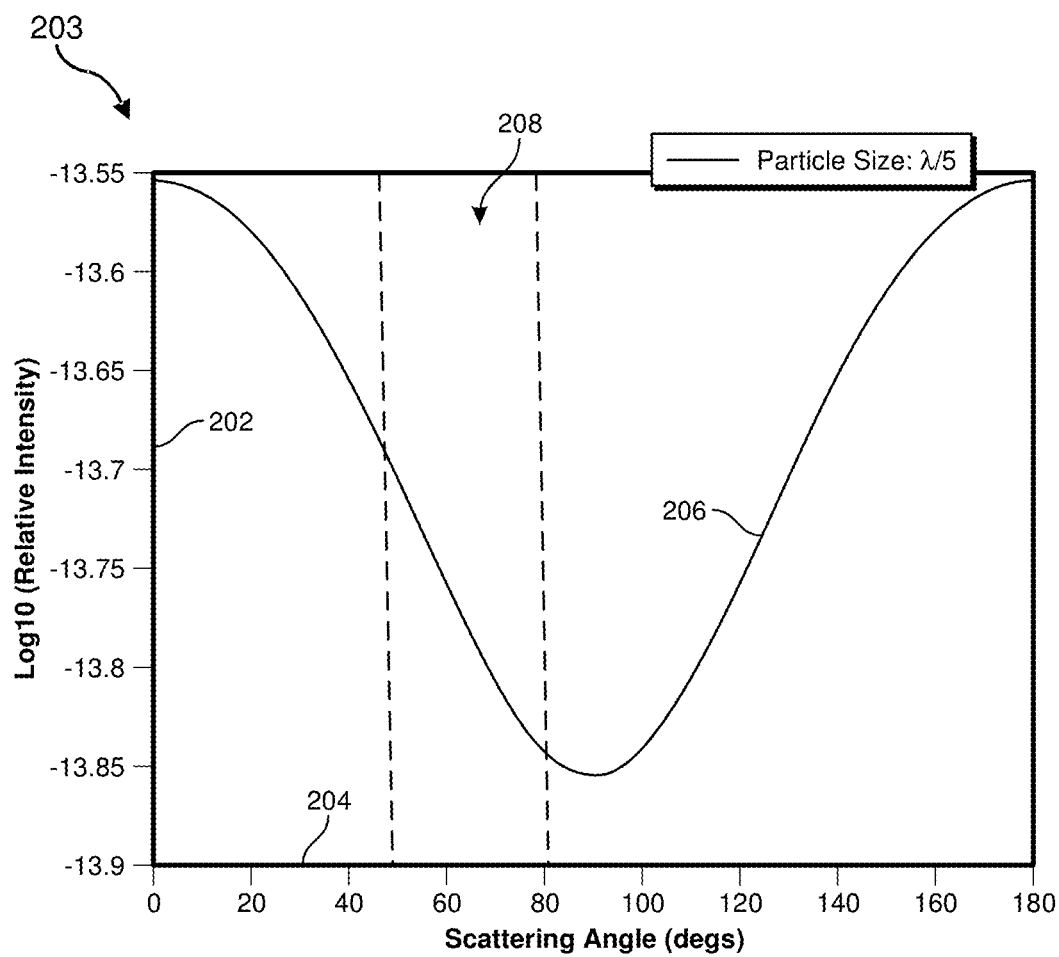
FIG. 2B is an illustration of an exemplary plot of the intensity of scattered light from a particle (e.g., a nanovoid) as a function of the angle of incident light on an electroactive element in a switchable electroactive device.

FIG. 2B illustrates an exemplary plot 203 of the intensity of light scattered from a particle (i.e., a nanovoid) as a function of the angle of incident light. In particular, plot 203 includes a y-axis 202 that represents a base-ten logarithm of the relative intensity of the scattered light (such as scattered light 214 of FIG. 2A) to the incident light (such as the incident light 210 of FIG. 2A). Further, plot 203 includes an x-axis 204 representing the scattering angle in units of degrees. Additionally, the angle represented by the x-axis 204 may be measured with respect to the incident light. Plot 203 also includes a curve 206 representing a case where the size of the particles (i.e., average diameter of nanovoids) is about one-fifth the wavelength of the incident light. As shown by curve 206, a relatively large portion of the scattered light may propagate in forward or backward directions with respect to the particles (e.g., angles in the range of about 0 degrees or about 180 degrees). Comparatively less scattered light may propagate in directions perpendicular to the incident light (e.g., angles in the range of about 90 degrees). In one embodiment, if the switchable electroactive device is illuminated using a projector (e.g., an ultra-short-throw projector) from the an off-axis position (as shown and described in connection with FIGS. 5-8, below), the scattering angle may be in the range of about 50 degrees to about 80 degrees in order for the light to propagate into the eyebox of an HMD as described herein. Accordingly, roughly 20% or less of the scattered light may propagate into the eyebox when the nanovoids have a particle size of about one-fifth the wavelength of the incident light.

Figure 3:
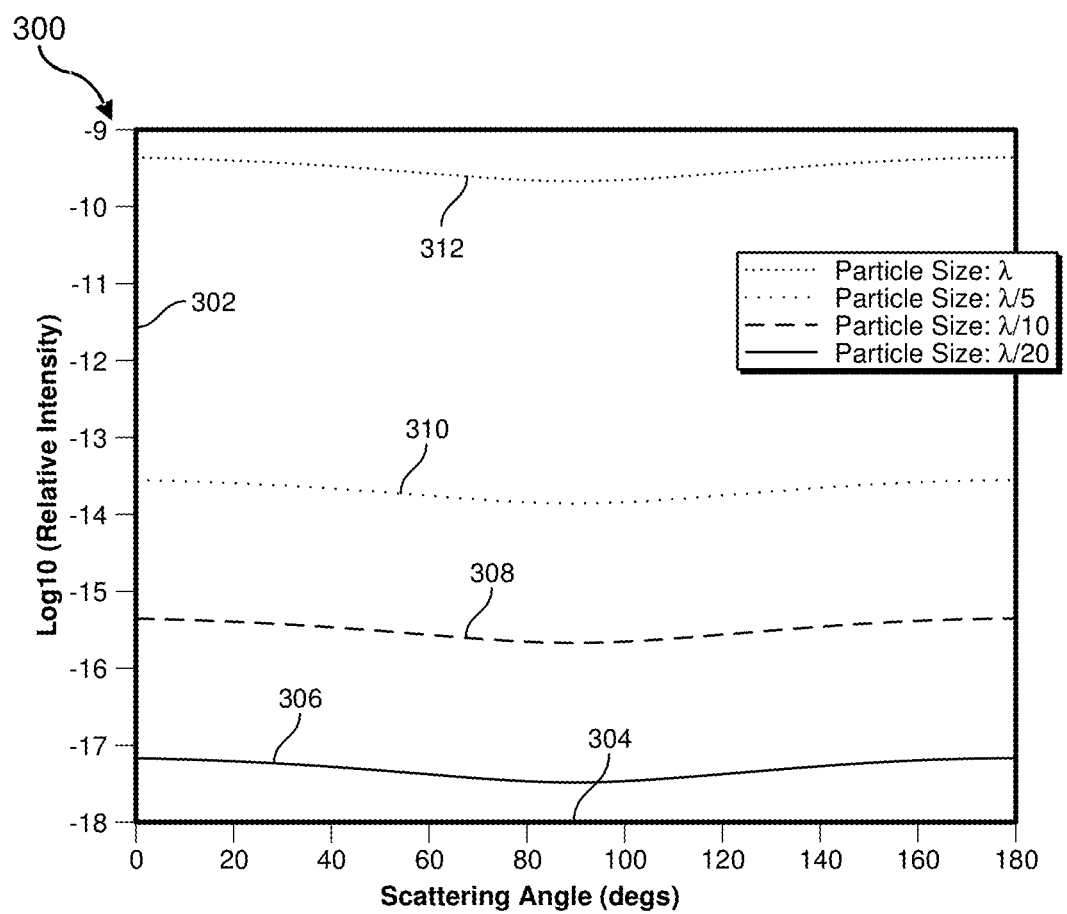
FIG. 3 is an illustration of an exemplary plot of the relative intensity of the scattered light as a function of size of a particle (e.g., nanovoid), and may explain why certain nanovoid sizes are used for optimal performance of the disclosed switchable electroactive device.

FIG. 3 shows the relative intensity of scattered light as a function of particle size. Again, the particles may correspond to nanovoids in the various electroactive elements described herein. Diagram 300 includes a y-axis 302 that represents the base-ten logarithm of the relative intensity of scattered light from the particles to light incident on the particles. Further, diagram 300 includes an x-axis 304 that represents the scattering angle of the light with respect to the particles in units of degrees. Moreover, diagram 300 includes curves 306, 308, 310, and 312 that represent the sizes of the particles, the sizes varying from about $\lambda/20$, about $\lambda/10$, about $\lambda/5$, and about $\lambda$, respectively. Diagram 300 illustrates that, as the particle size changes by a factor of about twenty, the amount of scattered light changes by about eight orders of magnitude. Diagram 300 therefore illustrates how the size of the nanovoids in the electroactive elements described herein may be configured to provide for optimal light scattering suited to particular display modes in the electroactive devices used in an HMD.

Figure 4A:
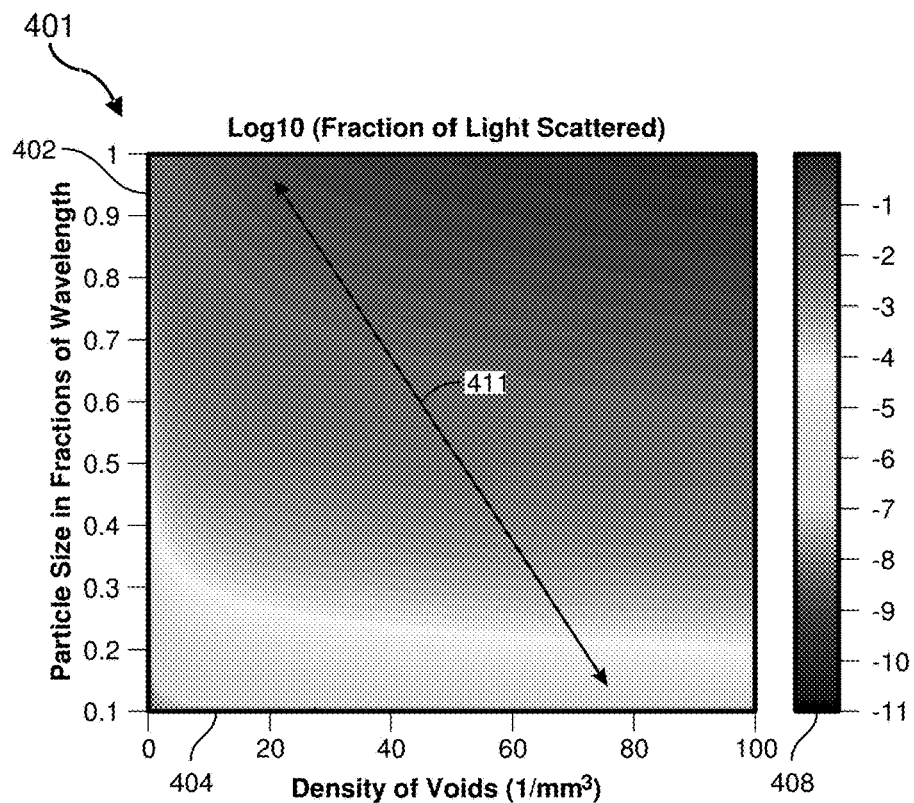
FIGS. 4A and 4B are exemplary graphical representations of the fraction of scattered light as a function of the density of particles in a volume and as a function of particle size, which may explain why certain nanovoid densities provide for optimal performance of the disclosed switchable electroactive device.

FIG. 4A illustrates an exemplary graphical representation of the fraction of scattered light as a function of density of particles in a volume and as a function of particle size. Diagram 401 includes a y-axis 402 that represents the particle size (e.g., nanovoid size) as a fraction of the wavelength of incident light in normalized units. Further, diagram 401 includes an x-axis 404 that represents the density of the nanovoids in units of cubic millimeters. Additionally, diagram 401 includes a heat map represented by legend 408 that corresponds to the base-ten logarithm of the fraction of scattered light from the particles.

Diagram 401 demonstrates that incident light may be scattered when the density of particles increases and as the particle size increases. Moreover, diagram 401 shows that, for certain densities (for example about fifty particles per cubic millimeter), if the particle size changes from about 0.1 to about 1 units of wavelength, the amount of scattered light may change by more than five to six orders of magnitude. For example, arrow 411 indicates that the scattered light intensity may change as the size and density of the nanovoids changes during mechanical compression and relaxation of an electroactive element. Accordingly, diagram 400 illustrates how the sizes and/or densities of the nanovoids may be configured in the electroactive elements described herein to provide for optimal scattering suited to particular display modes in connection with the electroactive devices.

Figure 4B:
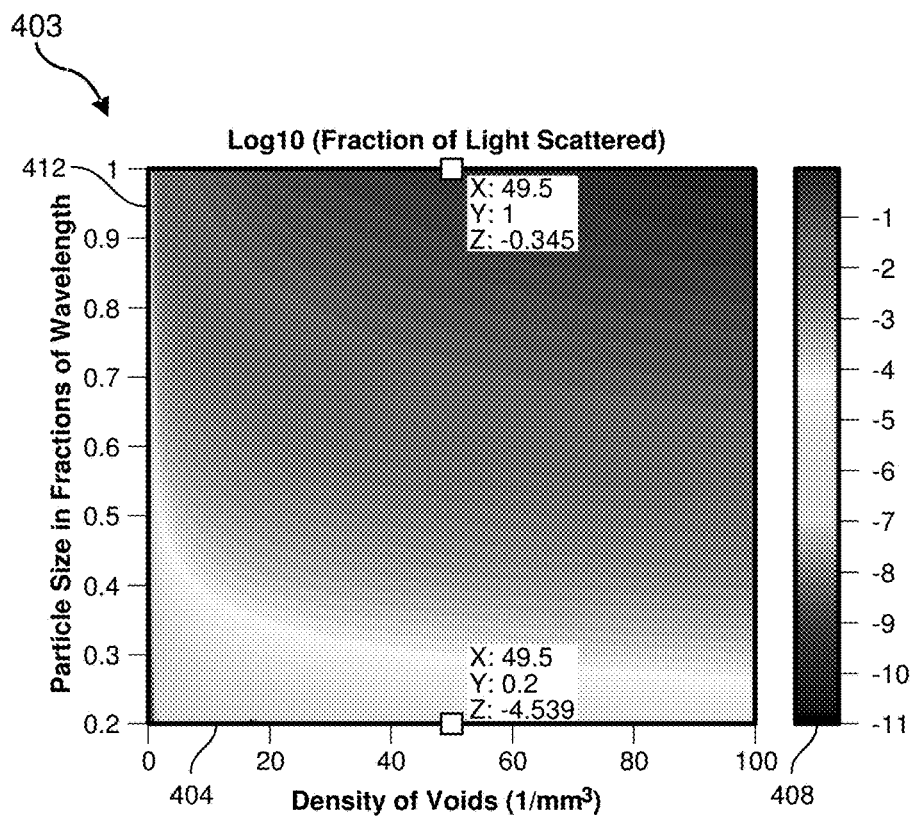

FIG. 4B illustrates another exemplary graphical representation of the fraction of scattered light as a function of density of particles in a volume and as a function of particle size. Moreover, diagram 403 shows a different scale (e.g., a zoomed-in scale) for the y-axis 412 than that of corresponding y-axis 402 of FIG. 4A. Additionally, two representative points have been shown in connection with diagram 403, namely (49.5, 0.2, −4.539) and (49.5, 1, −0.345), where the points are represented as (X, Y, Z) tuples, where X represents the density of the particles, Y represents the particle size, and Z represents the fraction of scattered light from the particles. Accordingly, the points represent different fractions of scattered light based on different densities and sizes of nanovoids.

Figure 5:
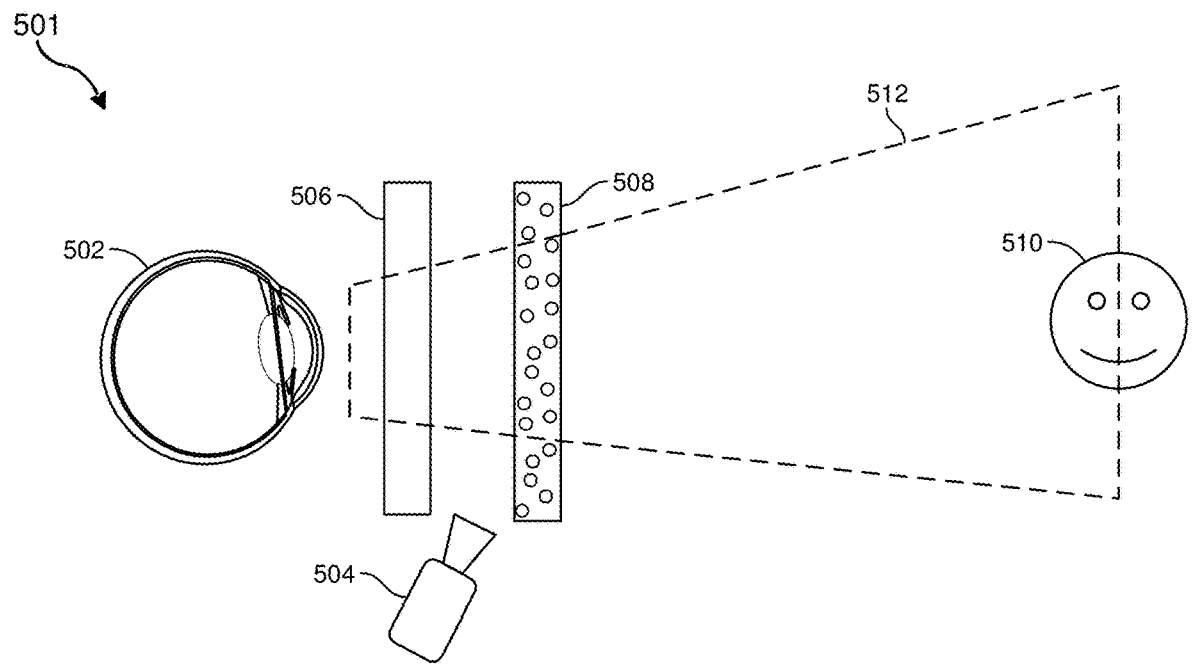
FIG. 5 is an illustration of an exemplary scenario demonstrating the use of a switchable electroactive device in an compressed (e.g., transmissive) state for virtual reality (VR) and mixed reality (MR) applications.

In some embodiments, as described further below, the electroactive device may be used as a screen in conjunction with a projector that can project light at visible or near-visible wavelengths. FIG. 5 is an illustration of an exemplary scenario demonstrating the use of a switchable display screen for various artificial-reality applications (e.g., virtual-reality, augmented-reality, and/or mixed-reality applications). As shown in diagram 501, components of an exemplary HMD may include a projector 504 (e.g., an ultra-short-throw projector) that is positioned off-axis with respect to an eyepiece 506 and an electroactive device 508 (e.g., a screen) to project light onto the electroactive device 508. The eyepiece 506 may be positioned between the eye 502 of a user and the electroactive device 508. In this example, the eyepiece 506 may include at least two states, or modes, of operation. In FIG. 5, the eyepiece 506 may be in an inactive state (or an active state in some examples). The electroactive device 508 may include an electroactive element in a compressed state (e.g., where the electroactive element is transparent), similar to the state shown and described in connection with FIG. 1B, above. In the inactive state, the eyepiece 506 may serve as a low power optical element or as an optical window. Further, when the eyepiece 506 is in the inactive state, the electroactive device 508 may also be in a compressed state where the electroactive device 508 is transparent or semi-transparent. Accordingly, light 512 may be transmitted through the electroactive device 508, allowing for the user's surroundings, which include an object 510, to be viewed by the user's eye 502.

In some examples, the eyepiece 506 may include any suitable type of lens or combination of lenses, such as a pancake lens, a geometric phase lens, and/or a meta lens. In some examples, the eyepiece 506 may be a pancake lens in a predetermined polarization state. The inactive state of the eyepiece 506 may be used in conjunction with the compressed state of the electroactive device 508, shown in FIG. 5, to enable the user to view the surrounding environment.

Figure 6:
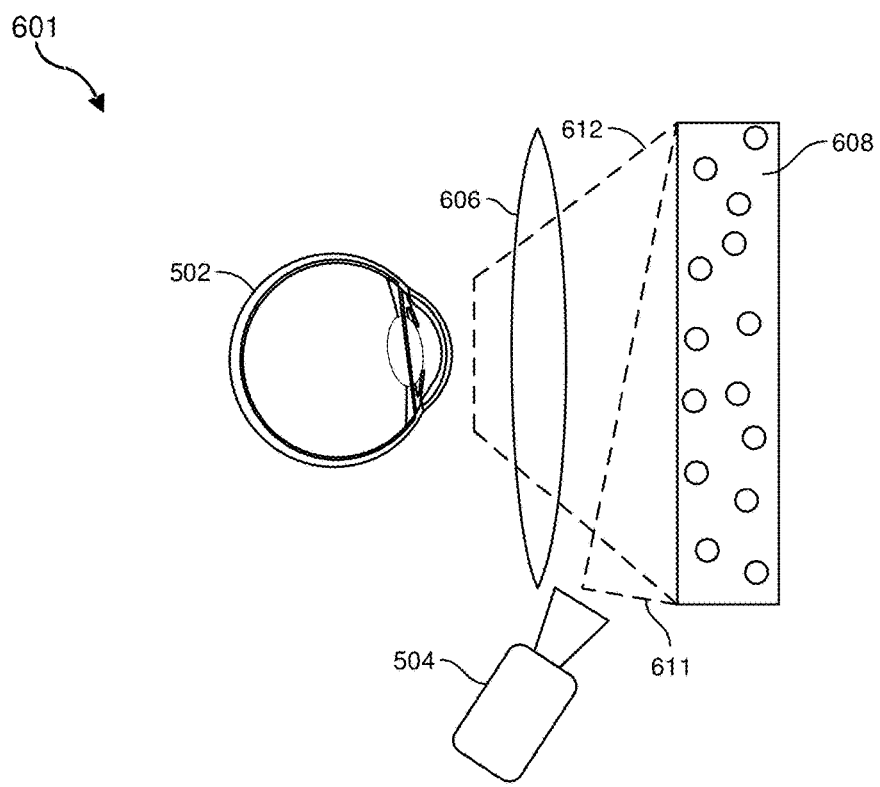
FIG. 6 is another illustration of another exemplary scenario showing a switchable electroactive device in an uncompressed (e.g., opaque) state for VR and MR applications.

FIG. 6 is an illustration of another exemplary scenario demonstrating a switchable display screen for virtual-reality and mixed-reality applications. In particular, diagram 601 of FIG. 6 represents the same components as that of diagram 501 of FIG. 5 shown and described above; however, the electroactive device 608 is in an uncompressed state that is opaque or substantially opaque (e.g., similar to the uncompressed state of the electroactive device shown and described in connection with FIG. 1A, above) and is utilized as a screen that is viewable by eye 502. The uncompressed state of the electroactive device 608 may be configured (e.g., via a switching circuitry, not shown) to correspond to the projection of light 611 (i.e., image light) by the projector 504 onto the electroactive device. Moreover, the eyepiece 606 may be configured (e.g., via a switching circuitry, not shown) to be in an active state (or an inactive state in some examples) at a time when the electroactive device 608 is in the uncompressed state. In the active state, the eyepiece 606 may have a shorter focal length as compared with the eyepiece 506 in the inactive state shown in FIG. 5, above. Therefore, the eyepiece 606 may focus light 612 from the switchable electroactive device 608 in the uncompressed state. Accordingly, the electroactive device 608 in the uncompressed state may scatter the light 612 towards the user's eye 502, for example, via an eyebox (not shown) of the HMD. The resolution of the system depicted in diagram 601 may be determined, at least in part, by the density of nanovoids in the electroactive element in the electroactive device 608.

The active state of the eyepiece 606 may be used in conjunction with the uncompressed state of the electroactive device 608, as shown in FIG. 6, to block or partially obscure the user's view of the external environment for use in a virtual-reality, mixed-reality, and/or augmented-reality application.

Figure 7:
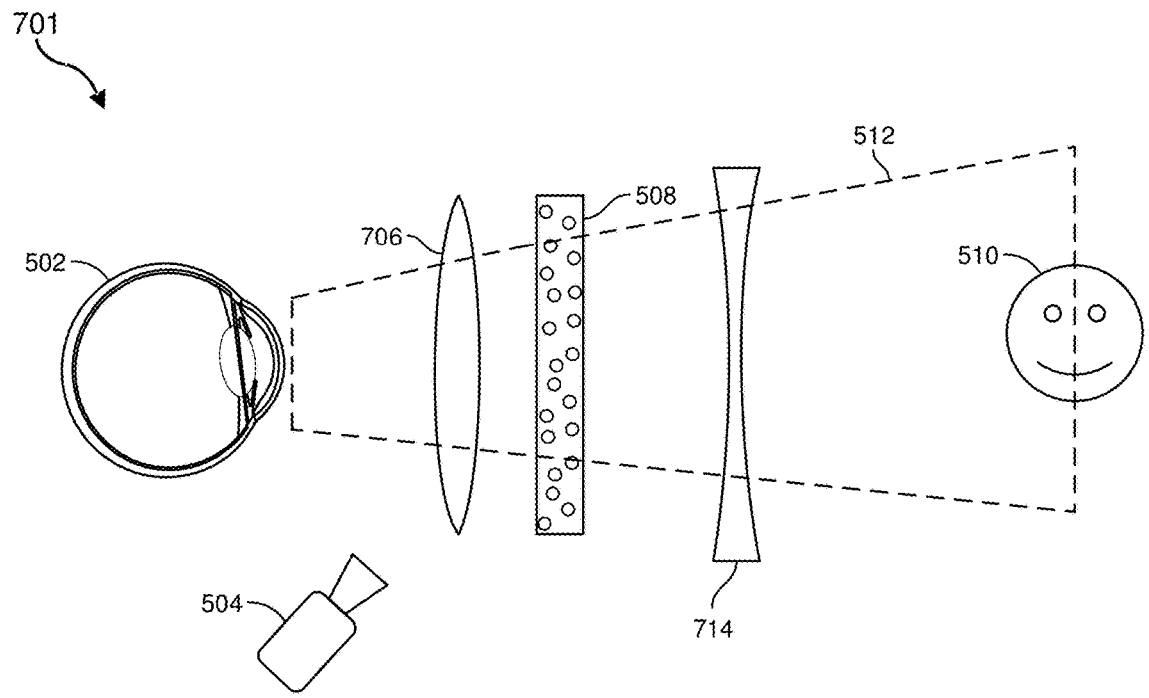
FIG. 7 is an illustration of an exemplary scenario showing a switchable electroactive device in a compressed state along with corresponding eyepieces for use in VR and MR applications.

FIG. 7 is an illustration of an exemplary scenario demonstrating a switchable display screen and eyepieces for virtual-reality, augmented-reality, and/or mixed-reality applications. In particular, diagram 701 of FIG. 7 represents the same components of an HMD as that of diagram 501 of FIG. 5 shown and described above; however, diagram 701 includes an additional eyepiece 714. The eyepiece 706 may be referred to as a proximate eyepiece 706 and the additional eyepiece 714 may be referred to as a distal eyepiece 714. Moreover, the additional eyepiece 714 may be positioned near a surface of the electroactive device 508 opposite the proximate eyepiece 706. Additional eyepiece 714 may be configured to enable the user to focus on the external environment (e.g., including object 510) without adjusting a state of eyepiece 706, which is also configured to focus image light reflected from electroactive device 608 to the user's eye 502 when electroactive device 608 is in an uncompressed, opaque state (see FIG. 8).

As depicted in diagram 701, light 512 may propagate from various objects in the external environment, such as object 510, through the additional eyepiece 714 and other optical components, including electroactive device 508 in a compressed (i.e., transparent) state and eyepiece 706, to travel to the user's eye 502. In such an application as depicted in diagram 701, the projector 504 may be in an off state. In the exemplary scenario illustrated in diagram 701, the user's eye 502 may view object 510 in the real world (e.g., in an augmented-reality application), without interference from the electroactive device 508. In some embodiments, additional eyepiece 714 may allow for the user to view the external environment without changing (or minimally changing) the state of eyepiece 706, allowing the user to focus on both the external environment (e.g., object 510) when electroactive device 508 is in the compressed state of FIG. 7 and an image displayed on electroactive device 608 when electroactive device 608 is in the uncompressed state of FIG. 8 with little or no adjustment to a state of eyepiece 706 or additional eyepiece 714. Additionally or alternatively, eyepiece 706 and/or additional eyepiece 714 may be adjustable (e.g., a bi-stable eyepiece), allowing for focal adjustments by switching between an active and an inactive state, as described above in relation to FIGS. 5 and 6. In at least one example, the user's eye 502 may be prescriptively corrected by one or more of the eyepiece 706 or the additional eyepiece 714.

Figure 8:
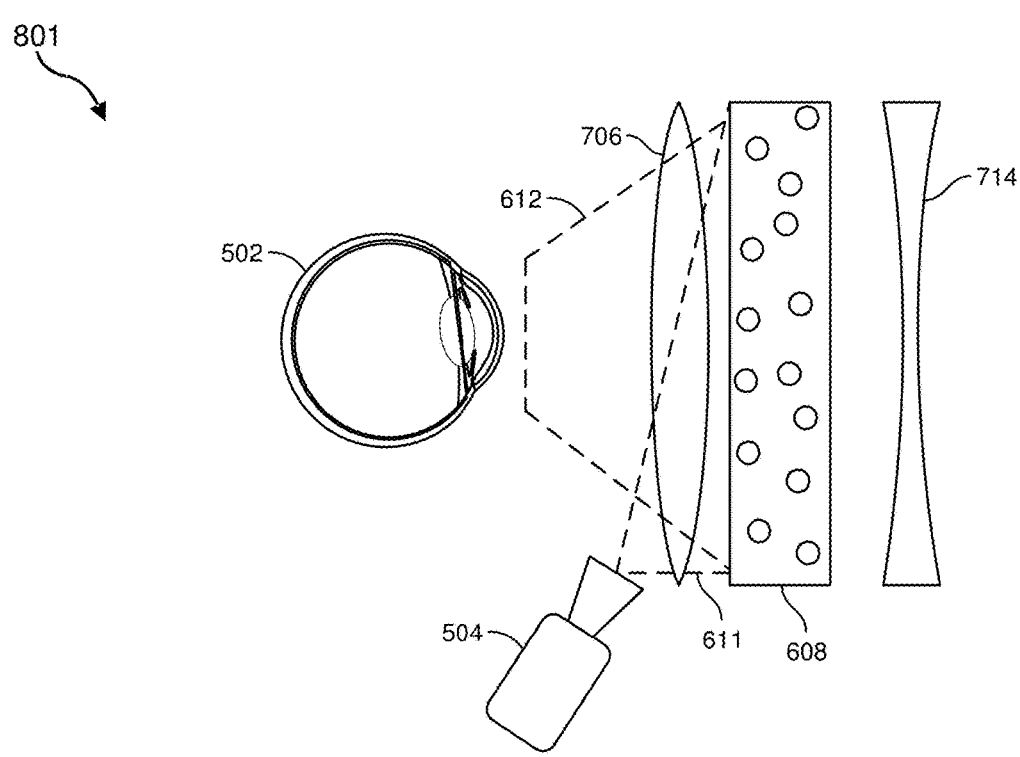
FIG. 8 shows is an illustration of another exemplary scenario showing a switchable electroactive device in an uncompressed state along with corresponding eyepieces for use in VR and MR applications.

FIG. 8 shows an illustration of another exemplary scenario demonstrating a switchable display screen and eyepieces for virtual-reality, augmented-reality, and/or mixed-reality applications. In particular, diagram 801 of FIG. 8 represents the same components as that of FIG. 7. However, in diagram 801, the electroactive device 608 is in an uncompressed state that is opaque or substantially opaque (e.g., similar to the state of the electroactive device shown and described in connection with FIG. 1A, above) and is utilized as a screen that is viewable by eye 502. The disclosed systems may configure (e.g., via a switching circuitry, not shown) the uncompressed state of the electroactive device 608 to correspond to the projection of light 611 (i.e., image light) by the projector 504 onto the electroactive device 608. The eyepiece 706 may focus light 612 from the switchable electroactive device 608, which is in the uncompressed state. Accordingly, the electroactive device 608 may scatter the light 512 towards the user's eye 502, for example, via an eyebox (not shown) of the HMD.

In the exemplary scenario depicted in diagram 801, the light 512, which is blocked and reflected towards the eye 502 by switchable electroactive device 608, may not reach, or may be inhibited from reaching, the additional eyepiece 714. The resolution of the optical system depicted in diagram 801 (or in diagram 601 of FIG. 6, above) may be determined, at least in part, by the density of nanovoids in the electroactive element in the electroactive device 608. Further, in augmented-reality applications, switchable electroactive device 608 (and/or one or more other components, such as a switchable eyepiece 706 and/or eyepiece 714 in some examples) may have a relatively fast switching speed, enabling use of the HMD in augmented-reality applications. If one or more of the components (e.g., switchable electroactive device 608, and a switchable eyepiece 706 and/or eyepiece 714 in some examples) do not have relatively fast switching speeds, the system may be used in virtual-reality and/or mixed-reality applications as compared with augmented-reality applications.

Figure 9:
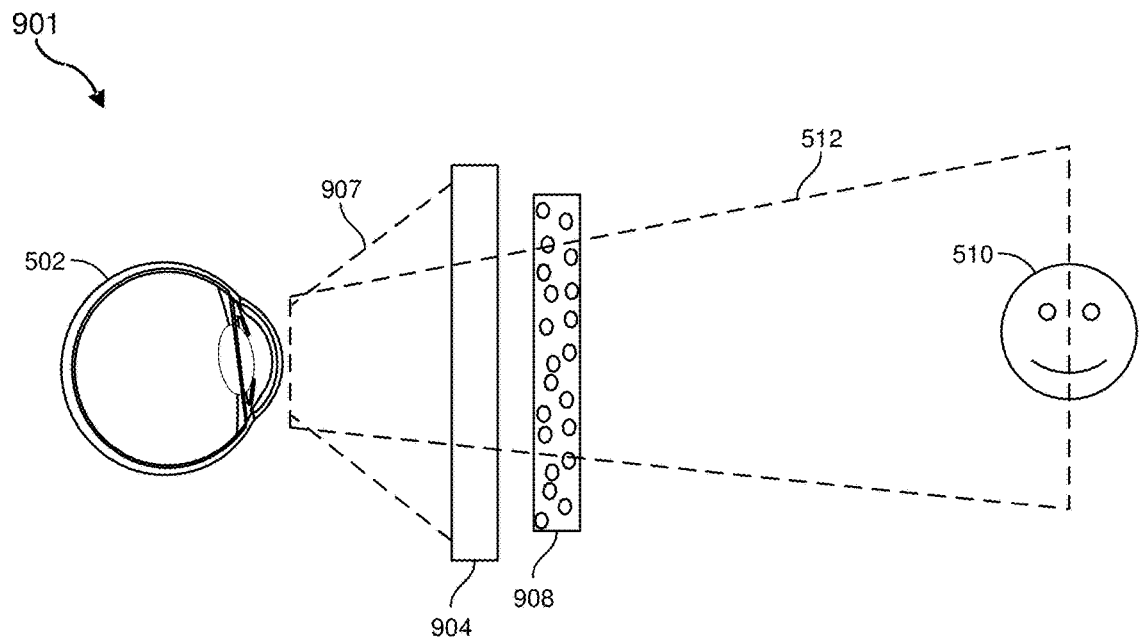
FIG. 9 is an illustration of an exemplary scenario showing a switchable electroactive device in a compressed state for use with a waveguide display for use in augmented-reality applications.

FIG. 9 is an illustration of an exemplary scenario demonstrating a switchable privacy screen in a compressed state for augmented-reality applications. In particular, diagram 901 of FIG. 9 includes some of the components also shown in diagram 501 of FIG. 5, as described above, but has some notable differences. In particular, diagram 501 includes a waveguide display 904 and a switchable electroactive device 908. Further, diagram 900 does not include a projector (e.g., similar to projector 504 in diagram 501 of FIG. 5) and may not include an eyepiece (e.g., similar to eyepiece 506 in diagram 501). Moreover, as shown in diagram 901, waveguide display 904 may be positioned between the eye 502 and the electroactive device 908 and may be configured to transmit light 907 (i.e., image light) directly to the eye 502 without the aid of electroactive device 908 (i.e., without utilizing electroactive device 908 as a screen to reflect light toward eye 502).

Further, light 512 (which may include ambient light, including light from object 510) may propagate through the waveguide display 904, which may be at least partially transparent in the state depicted. The waveguide display 904 may be configured to operate with a light source (e.g., a microLED, an LED, an OLED, a laser, and/or the like). Diagram 901 illustrates that the switchable electroactive device 908 may be in a compressed state where the electroactive device 908 is transparent (e.g., similar to the state shown and described in connection with FIG. 1B, above). In the exemplary scenario illustrated in diagram 901, the user's eye 502 may view object 510 in the real world (e.g., in an augmented-reality or mixed-reality application), with little or no interference from the electroactive device 908 or waveguide display 904.

Figure 10:
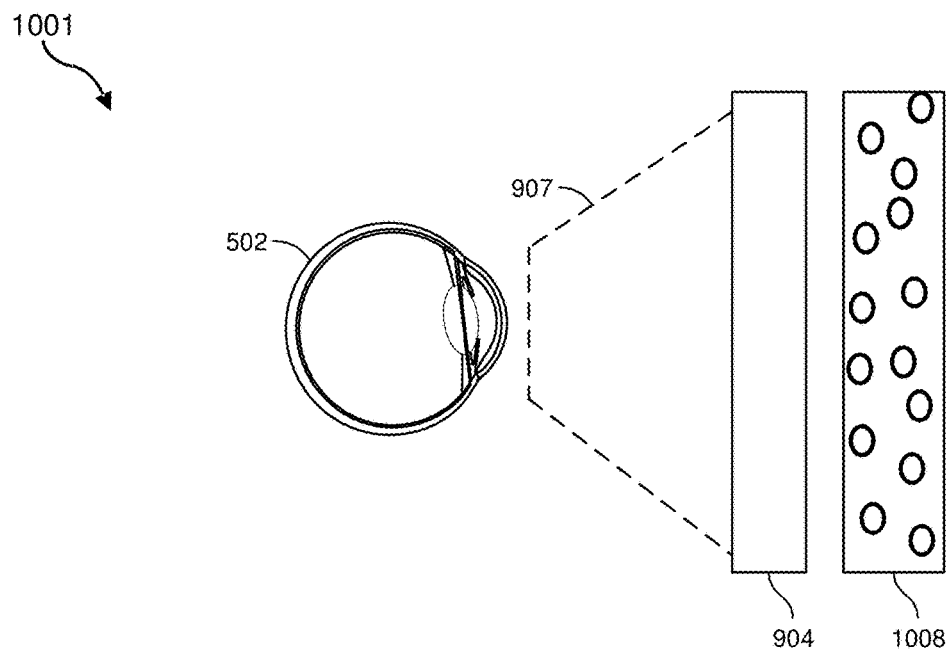
FIG. 10 is an illustration of another exemplary scenario showing a switchable electroactive device in an uncompressed state for use as a privacy screen use in for augmented-reality applications.

FIG. 10 is an illustration of another exemplary scenario demonstrating a switchable privacy screen (i.e., electroactive device 1008) in an uncompressed state for augmented-reality applications. In particular, diagram 1001 of FIG. 10 represents some of the components shown and described in connection with diagram 901 of FIG. 9 and diagram 501 of FIG. 5, above. Diagram 1001 also shows the waveguide display 904. Moreover, diagram 1001 includes switchable electroactive device 1008 in the uncompressed state. Further, diagram 1001 does not show a projector (e.g., projector 504 as shown in diagram 501). While diagram 1001 does not show an eyepiece (e.g., eyepiece 506 in diagram 501), an eyepiece may additionally be used in some examples to prescriptively correct the user's eye or to otherwise focus light from waveguide display 904.

As shown in diagram 1001, ambient light (e.g., light 512 shown in diagram 901 of FIG. 9, above) may be blocked by the switchable electroactive device 1008, which is in an uncompressed state where it is opaque or substantially opaque. This state may be similar to the uncompressed state of the electroactive device shown and described in connection with FIG. 1A, above.

In the exemplary scenario illustrated in diagram 1001, the user's eye 502 may view content displayed as light 907 via the waveguide display 904 (e.g., in a virtual-reality application) with little or no interference from ambient light. Moreover, the system depicted by diagram 1001 may provide a degree of privacy to the users of the HMD by using the electroactive device 1008 in an uncompressed opaque state that prevents content from being viewed by external individuals and devices.

The diagrams of FIGS. 5-10 shown and described above may be used in connection with a device such as an HMD. In some embodiments, the HMD may include a near eye display (NED), which may include one or more display devices that may present various media to a user. Examples of media presented by the display device include one or more images, a series of images (e.g., a video), audio, or some combination thereof. In some embodiments, audio may be presented via an external device (e.g., speakers and/or headphones) that receives audio information from the display device, a console (not shown), or both, and presents audio data based on the audio information. The display device may be generally configured to operate as an augmented-reality or mixed-reality NED, such that a user may see media projected by the display device and see the real-world environment through the display device. However, in some embodiments, the display device may be modified to also operate as a virtual-reality NED or some combination of virtual-reality, mixed-reality, and/or augmented-reality NED. Accordingly, in some embodiments, the display device may augment views of a physical, real-world environment with computer-generated elements (e.g., images, video, sound, etc.).

Figure 11:
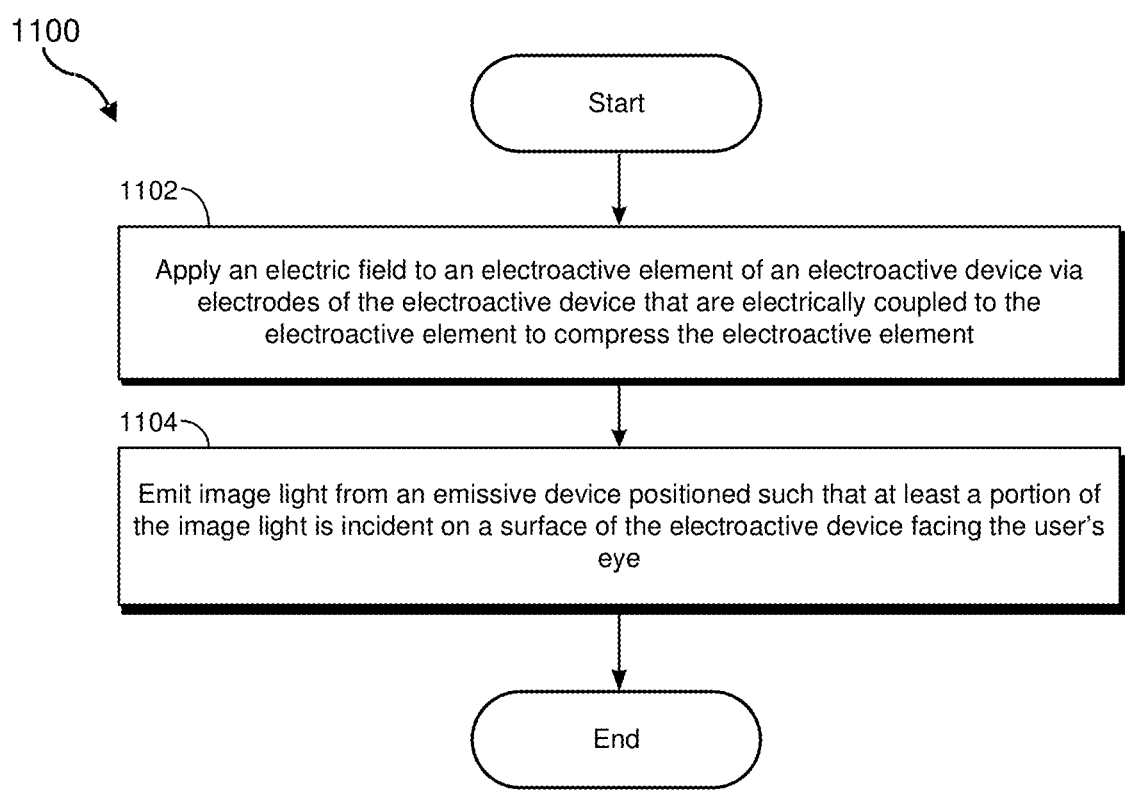
FIG. 11 illustrates an exemplary method for operating the switchable electroactive devices described herein.

FIG. 11 illustrates an exemplary method for operating an exemplary switchable electroactive device as described herein. At block 1102, the method may include applying an electric field to an electroactive element of an electroactive device via electrodes of the electroactive device that are electrically coupled to the electroactive element to compress the electroactive element from an uncompressed state to a compressed state, in accordance with various embodiments as described herein. In some examples, the electroactive element may include a polymer material defining nanovoids. The electric field may be applied to the electroactive element such that an average size of the nanovoids is decreased and a density of the nanovoids is increased in the electroactive element.

At block 1104, the method may include emitting image light from an emissive device positioned such that at least a portion of the image light is incident on a surface of the electroactive device facing the user's eye, in accordance with various embodiments as described herein. The emissive device may include, for example, at least one of an ultra-short throw projector or a waveguide display. According to various embodiments, the electroactive device may be positioned at a distance from a user's eye and may be substantially opaque in the uncompressed state and transparent in the compressed state. Additionally, a degree of scattering of incident light by the electroactive element may be based, at least in part, on at least one of the density or the average size of the nanovoids. In the uncompressed state of the electroactive element, the nanovoids may have a first average size on an order of a wavelength of incident light, and in the compressed state of the electroactive element, the nanovoids may have a second average size that is substantially smaller than the wavelength of the incident light.

An eyepiece may be positioned between the user's eye and the electroactive device and the eyepiece may be configured to modify a focus of the user's eye to a focal plane of the electroactive device in an active state of the eyepiece. In this example, the eyepiece may be a proximate eyepiece and the distal eyepiece may be positioned near a surface of the electroactive device opposite the proximate eyepiece. In some examples, the active state of the eyepiece may be used in a virtual reality application and an inactive state of the eyepiece may be used in an augmented reality application or a mixed reality application.

As variously described herein, the nanovoided electroactive elements may be used in electroactive devices. In some embodiments, the nanovoided electroactive elements may be used to fabricate switchable screens for augmented-reality systems that may serve as partially transparent displays that mix digital images with the real world. Light rays may reflect off the electroactive device to be redirected towards a user's eye. In other embodiments, the eye may receive redirected rays from the digital display (e.g., from a projector or light-emitting diodes). Further, the electroactive device may operate like a partial mirror or display screen that redirects display light and selectively lets light through from the real world depending on the state of the electroactive device. In such applications, a high scattering state for the redirected light along with a high transmission for ambient light may be desired. The electroactive device may include nanovoided electroactive elements having high switching speeds such that, when the electroactive device is switched on and off at a relatively rapid rate (e.g., an oscillating electric field is generated on the nanovoided electroactive element), the nanovoided electroactive element may be transmissive. Moreover, when the electroactive device is switched off, the nanovoided electroactive element may be in an uncompressed state where the electroactive element is configured to scatter light via Rayleigh scattering.

Electroactive Devices

In some applications, an electroactive device used in connection with the principles disclosed herein may include a first electrode, a second electrode, and an electroactive element disposed between the first electrode and the second electrode. The electroactive element may include an electroactive material such as an electroactive polymer (e.g., a NVP) and a plurality of voids (also referred to herein as nanovoids) distributed within the electroactive polymer, for example as a porous polymer structure. Voids may be generally isolated from each other, or, at least in part, be interconnected through an open-cell structure. The plurality of voids may have a non-uniform distribution within the electroactive polymer, and the electroactive element may have a non-uniform electroactive response when an electrical signal is applied between the first electrode and the second electrode, based on the non-uniform distribution of voids.

A non-uniform distribution of the plurality of voids may include a spatial variation in at least one of void diameter, void volume, void number density, void volume fraction, or void orientation (e.g., in the case of anisotropic voids). Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (for example, parallel to an applied electric field), change in curvature, or other change in a dimensional parameter, such as length, width, height, and the like, in one or more directions. An electroactive device may have a first deformation on application of a first voltage between the first and second electrodes, and a second deformation on application of a second voltage between the first and second electrodes, with the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied root-mean-square (RMS) electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature.

In some embodiments, an electroactive device may include an optical element mechanically coupled to the electroactive element. An optical element may include at least one of a lens, a grating, a prism, a mirror, or a diffraction grating. In some embodiments, the electroactive device may be a component of a wearable device. The wearable device may include a helmet or other headwear, an eyewear frame, a glove, a belt, or any device configured to be positioned adjacent to or proximate the body of a wearer, for example to support the electroactive device proximate a user when the user wears the wearable device, and the electroactive device may be configured to provide a tactile signal to the user. In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, with the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion.

The electroactive device may be a component of a wearable device, configured to be worn by a user. The wearable device may be configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger. In some embodiments, a method includes generating an electroactive response in an electroactive device, the electroactive device including an electroactive element located between a first electrode and a second electrode, wherein the electroactive response to an electrical input or a mechanical input varies appreciably over a spatial extent of the electroactive device due to a non-uniform distribution of voids within the electroactive element.

In some embodiments, the electroactive response may include a mechanical response to the electrical input that varies over the spatial extent of the electroactive device, with the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal is used to determine a gesture by the user, the gesture including a finger movement. In some embodiments, typing inputs by a user, e.g., into a virtual keyboard, may be determined from sensor signals.

In some embodiments, an electroactive device may include one or more electroactive elements, and an electroactive element may include one or more electroactive materials, which may include one or more electroactive polymer materials. In various embodiments, an electroactive device may include a first electrode, a second electrode overlapping at least a portion of the first electrode, and an electroactive element disposed between the first electrode and the second electrode. In some embodiments, the electroactive element may include an electroactive polymer. In some embodiments, an electroactive element may include an elastomer material, which may be a polymer elastomeric material. In some embodiments, the elastomer material may have a Poisson's ratio of approximately 0.35 or less. The electroactive element may be deformable from an initial state to a deformed state when a first voltage is applied between the first electrode and the second electrode, and may further be deformable to a second deformed state when a second voltage is applied between the first electrode and the second electrode.

In some embodiments, there may be one or more additional electrodes, and a common electrode may be electrically coupled to one or more of the additional electrodes. For example, electrodes and electroactive elements may be disposed in a stacked configuration, with a first common electrode coupled to a first plurality of electrodes, and a second common electrode electrically connected to a second plurality of electrodes. The first and second pluralities may alternate in a stacked configuration, so that each electroactive element is located between one of the first plurality of electrodes and one of the second plurality of electrodes.

In some embodiments, an electroactive element may have a maximum thickness in an undeformed state and a compressed thickness in a deformed state. In some embodiments, an electroactive element may have a density in an undeformed state that is approximately 90% or less of a density of the electroactive element in the deformed state. In some embodiments, an electroactive element may exhibit a strain of at least approximately 10% when a voltage is applied between the first electrode and the second electrode.

In some embodiments, an electroactive element may include at least one non-polymeric component in a plurality of defined regions and the method may further include removing at least a portion of the at least one non-polymeric component from the cured elastomer material to form a nanovoided polymer material.

In some embodiments, an electroactive device may include an electroactive polymer configured with a first location of patterned nanovoids such that the first location has a different transduction behavior from a second location having a second location of patterned nanovoids. In some embodiments, a global electric field applied over the entirety of an electroactive element generates differential deformation between the first and second locations. An electroactive element may have a plurality of locations of patterned nanovoids such that when a first voltage is applied the EAP exhibits a predetermined compound curvature. The electroactive device may exhibit a second predetermined compound curvature, different from the first predetermined compound curvature, when a second voltage is applied. A wearable device may include an electroactive device, where the first compound curvature provides a first tactile feeling and the second compound curvature provides a second tactile feeling to a person when the person is wearing the wearable device. In some electrodes, the first electrode and/or the second electrode may be patterned, allowing a localized electric field to be applied to a portion of the device, for example to provide a localized compound curvature.

In some embodiments, a sensor may include an electroactive device, where the electroactive device includes a first and a second portion, where the first portion has a different sensor response than the second portion due to a non-uniform distribution of patterned nanovoids. The sensor may be a wearable device. The sensor may be in electrical communication with a controller configured to determine a flexure of a wearable device based on the one or more electrical outputs from the wearable device. For example, the wearable device may include one or more electroactive devices configured as sensors. In some embodiments, a sensor may be configured to determine a joint position of a wearer of the sensor based on the one or more electrical signals from the sensor. The sensors may be part of a glove or other wearable device. In some embodiments, the sensor may include an arrangement of electroactive sensors and may be configured to determine keystrokes into a keyboard, where the keyboard may be a real or virtual keyboard.

A non-uniform distribution of voids within an electroactive element may include a functional dependence on a distance parameter, such as distance from an edge and/or center of an electroactive element. For example, an electroactive element may have a generally rectangular shape with a generally uniform thickness. In some embodiments, the volume fraction of voids may increase monotonically along a direction parallel to a longer side and/or a shorter side of the rectangular shape. In some examples, the void volume fraction may have a highest value in some portion of the electroactive element and decrease from the highest portion to portions with lower void volume fractions elsewhere, for example proximate an edge. In some examples, the void volume fraction may have a lowest value in some portion of the electroactive element and increase from the lowest portion to portions with higher void volume fractions elsewhere, for example proximate an edge of the electroactive element. In some examples, an electroactive element may have a generally disk shape. The volume fraction of voids may vary as a function of a radial distance from the disk center. In some embodiments, the volume fraction may be highest in a central portion of a disk-shaped electroactive element and decrease along a radial direction to an edge. In some embodiments, the volume fraction may be lowest in a central portion and increase along a radial direction to an edge. The variation in void volume fraction may have a functional relationship with a distance parameter, for example including one or more of a linear, quadratic, sinusoidal, undulating, parabolic, or other functional relationship with a distance parameter along one or more of the relevant distance parameters. For example, a distance parameter may be determined as the distance along an edge, obliquely across, from a center, or other distance measurement for a given electroactive element.

An electroactive element can convert deformations into electrical signals, such as proportional electrical signals that scale with a deformation parameter (such as applied pressure). An electroactive element may also receive an electrical signal that induces a deformation based on the electrical signal (for example, based on the voltage squared or mean square voltage). An electroactive device may be a transducer, with a degree of deformation based on the electrical signal, and/or as a sensor providing an electrical signal based on a degree of deformation. The electroactive response may be mediated by the dielectric constant and elastic modulus of the electroactive element. Using a single homogeneous polymer film constrains the transducer response to a particular input electrical signal/output mechanical response across the device. In some embodiments, an electroactive device actuates and/or senses deformations as a function of position within a single device, without the need for complex electrode structures, facilitating electroactive devices (such as transducers and/or sensors) capable of spatially variable actuation and sensing responses, using a simple electrical architecture such as a pair of electrodes.

In some embodiments, a device may include a transducer that converts variations in a physical quantity into an electrical signal, and/or vice versa. In some embodiments, the electrical response of a transducer may be correlated with a location of a mechanical input. The process by which variations in a physical quantity transforms into an electrical signal, and/or vice versa, may be referred to as transduction. A transducer may include an electroactive element, such an electroactive polymer element. In some examples, an electroactive element may include an electroactive polymer with a distribution of voids formed therein.

In some embodiments, an electroactive element may include a distribution of voids. In some embodiments, a void may include a region filled with a different medium, such as a non-polymeric material, such as a gas such as air, or a liquid. A portion of the electroactive element may have a volume fraction of voids, which may be determined as the void volume within a portion of the electroactive element divided by the total volume of the portion of the electroactive element. In some embodiments, the void volume fraction may be a function of a distance parameter. For example, the void volume fraction may be a linear function of a distance from one edge of an electroactive element, for example increasing in a generally linear fashion from one side to another. In some examples, the volume void fraction may be a non-linear function of a distance parameter, such as a polynomial function (such as a quadratic function), a step function, a parabolic function, an undulating function, a sine function, or the like. A distance parameter may be a distance from an edge of an electroactive element. In some embodiments, an electroactive element may have a generally cuboid shape, for example having a length, width, and thickness, for example as determined along generally mutually orthogonal directions. The thickness of the electroactive element may be approximately equal to the electrode separation. In some embodiments, an electroactive element may have a disk shape, a wedge shape, an elongated form such as a rod, or other shape. A distance parameter may be (as appropriate) a distance along an edge (e.g. a distance from one side towards another side), a radial distance (e.g. a distance from a center or an edge of a disk-shaped form in a generally radial direction), or other distance measurement. In some embodiments, a volume void fraction may be a function of a distance parameter over a plurality of electroactive elements, for example including a plurality of electroactive elements having different mean void volume fractions (optionally having an appreciable internal variation of void volume fraction, or in some embodiments no appreciable internal variation of void volume fraction) arranged to obtain a desired variation of void volume fraction with distance across a plurality of electroactive elements.

In some embodiments, a system may include at least one physical processor, a physical memory including computer-executable instructions that, when executed by the physical processor, cause the physical processor to apply an electrical field across an electroactive device to obtain non-uniform actuation based on a non-uniform distribution of voids within an electroactive element of the electroactive device. In some embodiments, a system may include at least one physical processor, a physical memory including computer-executable instructions that, when executed by the physical processor, cause the physical processor to receive an electrical signal from an electroactive device, and to process the electrical signal to obtain a deformation parameter of the electroactive device, wherein the deformation parameter includes one or more of the following: a magnitude of a deformation, a location of a deformation, a bend angle, a gesture type (e.g., selected from a plurality of gesture types). The analysis of the electrical signal may be based at least in part on a non-uniform distribution of voids within an electroactive element of the electroactive device.

Electroactive Elements

In some embodiments, the electroactive elements described herein may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongates, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, a polymer element may include an elastomer. As used herein, an "elastomer" may (in some examples) refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, less than approximately 0.05). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, an electroactive element may include an elastomer material, which may have a Poisson's ratio of approximately 0.35 or less. In some embodiments, an electroactive element may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

An electroactive device may include a plurality of stacked layers; for example, each layer may include an electroactive element disposed between a pair of electrodes. In some embodiments, an electrode may be shared between layers; for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the electroactive device.

Electroactive Polymers

An electroactive element may include one or more electroactive polymers and may also include additional components. As used herein, "electroactive polymers" may (in some examples) refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications.

In some embodiments, an electroactive polymer may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidenefluoride-co-trifluoroethylene) (PVDF-TrFE)).

Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

Voids

In some embodiments, the electroactive elements described herein may include voids, such as nanovoids (e.g., having a plurality of voids and/or nanoscale-sized voids in an electroactive element including an electroactive polymer or composite thereof). In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the electroactive elements. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, and/or approximately 1000 nm).

In some embodiments, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from an expression (DR=D_uncompressed/D_compressed), where DR may represent the effective density ratio, D_uncompressed may represent the density of the uncompressed polymer, and D_compressed may represent the density of the uncompressed polymer.

The density of voids within an electroactive element, or other dielectric material, may vary as a function of position. In some embodiments, the volume fraction of an electroactive component (or dielectric material) may vary between 10% and 60%. The structure of the voids may be interconnected (open cell) or the voids may be fully enclosed by suitable dielectric material (closed cell). The voids may be partially filled with a dielectric liquid or dielectric gas. The voids may be partially coated with a layer of suitable material. In some embodiments, a voided material (such as a porous material) may be fabricated using a templating agent, such as a material that directs the structural formation of pores or other structural elements of an electroactive element. A templating agent may be any phase of matter (solid, liquid, gas). In some embodiments, a templating agent is removed to produce a pore (or void).

Particles

In some embodiments, the electroactive elements described herein may include particles including a material having a high dielectric constant, with the particles having an average diameter between approximately 10 nm and approximately 1000 nm. In some embodiments, the material having the high dielectric constant may include barium titanate.

In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate ($BaTiO_3$), or other perovskite material such as other titanates.

Additionally or alternatively, any other suitable component may be added to the electroactive polymer material. $BaTiO_3$ is a ferroelectric material with a relatively high dielectric constant (e.g., a value of between approximately 500 and approximately 7000) and polarization and may be used in various electroactive devices described herein.

Besides large polarizability and permittivity, large strains may also be achievable with BaTiO3. Pure BaTiO3 is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, an electroactive device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, e.g., by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example a dielectric liquid or a dielectric gas with high dielectric strength gas, such as a halide, in particular a fluoride such as is sulfur hexafluoride, organofluoride or the like.

Electrodes

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode, or any other electrode) may include a metal such as aluminum, gold, silver, tin, copper, indium, gallium, zinc, and the like. An electrode may include one or more electrically conductive materials, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, electroactive devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, e.g., through a contact layer, to a common electrode. In some embodiments, an electroactive device may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), e.g., a second electrode and a third electrode located either side of a first electrode. In some embodiments, an electroactive device may include additional electroactive elements interleaved between electrodes, for example in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, an electroactive device may include more (e.g., two, three, or more) such additional electroactive elements and corresponding electrodes. For example, an electroactive device may include a stack of two or more electroactive elements and corresponding electrodes. For example, an electroactive device may include between 2 electroactive elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements.

In some embodiments, electrodes may be flexible and/or resilient and may stretch, for example elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where electroactive devices have electroactive elements including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape, or may be a more complex shape (e.g., patterned or freeform). In some embodiments, a common electrode may be shaped to allow compression and expansion of an electroactive device during operation.

Electrode Fabrication

In some embodiments, the electrodes described herein (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

Lens Assembly and Optical Systems

In some embodiments, the electroactive devices described herein may include or be mechanically coupled to one or more optical elements. An optical element may include a lens, mirror, prism, holographic element, beam splitter, optical filter, diffraction grating, a display, or other optical element. In some embodiments, an electroactive device, such as an actuator, may include or be mechanically coupled to an adjustable lens. An adjustable lens may include any suitable type of lens with adjustable optical properties (e.g., adjustable optical power/focal length, correcting for wavefront distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In some embodiments, an electroactive device may include one or more direct-drive benders, that may include an electroactive element that is disposed between two electrodes. In such examples, methods of forming an electroactive device may involve forming electrodes and an electroactive polymer simultaneously (e.g., via coflowing, slot die coating, etc.).

In some embodiment, a lens assembly may include multiple deformable optical elements (e.g., multiple deformable lenses, such as liquid lenses), where the deformation is provided by one or more electroactive devices.

Methods of Device Fabrication

Various fabrication methods are discussed herein. Properties of the electroactive element may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an electroactive element.

In some embodiments, the electroactive elements described herein (e.g., electroactive element 100) may be planarized during the fabrication of electroactive devices. Moreover, such planarization may be achieved either in batch or non-batch processing. In some examples, a planarization layer (PL) may be formed on a surface of the electroactive element. In another embodiment, solvent may be evaporated from the nanovoids electroactive element before the PL is formed. In some examples, the solvent may be allowed to remain in the nanovoids electroactive element during the PL formation, as the solvent may help exclude the PL components from the electroactive element. For example, a solvent may be used that is immiscible with the PL components. In some embodiments, the solvent may be allowed to partially evaporate before planarization. Such partial evaporation of the solvent may induce the partial collapse of the nanovoids, and result in the formation of anisotropic nanovoids, such as, for example, disk-shaped nanovoids. Further, the electroactive element may be partially cured before partial (or complete) solvent removal from electroactive element the nanovoids, for example, to achieve partial (or otherwise limited) nanovoid collapse. In some examples, the PL may be used to lock in some deformation of the electroactive element, such as deformation due to pre-stretching or other physical modifications of the electroactive element.

In some embodiments, polymers used for the PL may include, but not be limited to, acrylates, halogenated polymers such as fluoropolymers including polyvinylidene difluoride (PVDF, polytetrafluoroethylene), copolymers of PVDF including PVDF:TrFE (poly(polyvinylidene fluoride—trifluoroethylene), other fluorinated polyethylenes, other fluorinated polymers, other polymers, and/or blends or derivatives thereof. The polymers may include nanoparticles to increase dielectric constant, such as inorganic particles such as: titanates (including barium titanate or barium strontium titanate ($BaSrTiO_3$); oxides such as titanium dioxide ($TiO_2$), tantalum oxide ($Ta_2O_3$), aluminum oxide ($Al_2O_3$), or cerium oxide ($CeO_2$); other metal oxides such as other transition metal oxides, other non-metal oxides, or other compounds such as $PbLaZrTiO_3$, $PbMgNbO_3$ and/or $PbTi_3$. In some examples, the polymers used for the PL may additionally include mixtures of curable monomers with cured polymers.

In various embodiments, the PL may be created using the same polymer mixture as used in the generation of the electroactive element. Alternatively, the PL may be created using a different polymer material, for example, a polymer material having a similar elasticity parameter (e.g., Young's modulus) to that of a polymer component of the electroactive element. Further, adhesion between the PL and the electroactive element may be improved by matching mechanical and/or thermal properties of the PL to that of the electroactive element (e.g., a polymer matrix of the electroactive element).

Methods of forming an electroactive device include forming electrodes and electroactive elements sequentially (e.g., via vapor deposition, coating, printing, etc.) or simultaneously (e.g., via co-flowing, coextrusion, slot die coating, etc.). Alternatively, the electroactive elements may be deposited using initiated chemical vapor deposition (iCVD), where, for example, suitable monomers of the desired polymers may be used to form the desired coating. In some embodiments, monomers, oligomers, and/or prepolymers for forming the electroactive elements may optionally be mixed with a solvent and the solvent may be removed from the electroactive element during and/or following curing to form nanovoids within the electroactive element.

A method of fabricating an electroactive device may include depositing a curable material onto a first electrode, curing the deposited curable material to form an electroactive element (e.g., including a cured elastomer material) and depositing an electrically conductive material onto a surface of the electroactive element opposite the first electrode to form a second electrode. In some embodiments, the cured elastomer material may have a Poisson's ratio of approximately 0.35 or less. In some embodiments, a method may further include depositing an additional curable material onto a surface of the second electrode opposite the electroactive element, curing the deposited additional curable material to form a second electroactive element including a second cured elastomer material, and depositing an additional electrically conductive material onto a surface of the second electroactive element opposite the second electrode to form a third electrode.

In some embodiments, a method of fabricating an electroactive element may include vaporizing a curable material, or a precursor thereof, where depositing the curable material may include depositing the vaporized curable material onto the first electrode. In some embodiments, a method of fabricating an electroactive element may include printing the polymer or precursor thereof (such as a curable material) onto an electrode. In some embodiments, a method may also include combining a polymer precursor material with at least one other component to form a deposition mixture. In some embodiments, a method may include combining a curable material with particles of a material having a high dielectric constant to form a deposition mixture.

According to some embodiments, a method may include positioning a curable material between a first electrically conductive material and a second electrically conductive material. The positioned curable material may be cured to form an electroactive element including a cured elastomer material. In some embodiments, the cured elastomer material may have a Poisson's ratio of approximately 0.35 or less. In some embodiments, at least one of the first electrically conductive material or the second electrically conductive material may include a curable electrically conductive material, and the method may further include curing the at least one of the first electrically conductive material or the second electrically conductive material to form an electrode. In this example, curing the at least one of the first electrically conductive material or the second electrically conductive material may include curing the at least one of the first electrically conductive material or the second electrically conductive material during curing of the positioned curable material.

In some embodiments, a curable material and at least one of a first electrically conductive material or a second electrically conductive material may be flowable during positioning of the curable material between the first and second electrodes. A method of fabricating an electroactive device may further include flowing a curable material and at least one of the first electrically conductive material or the second electrically conductive material simultaneously onto a substrate.

In some embodiments, methods for fabricating an electroactive device (e.g., an actuator) may include masks (e.g., shadow masks) to control the patterns of deposited materials to form the electroactive device. In some embodiments, the electroactive device may be fabricated on a surface enclosed by a deposition chamber, which may be evacuated (e.g., using one or more mechanical vacuum pumps to a predetermined level such as 10-6 Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials (e.g., electrodes, polymer elements, and the like) that are mechanically coupled to the surface. In some embodiments, the surface may be fixed and the deposition and curing systems may move relative to the surface, or both the surface, the deposition, and/or curing systems may be moving simultaneously.

In some embodiments, an electroactive device (e.g., an actuator, sensor, or the like) may be fabricated by: providing an electrically conductive layer (e.g., a first electrode) having a first surface; depositing (e.g., vapor depositing) a polymer (e.g., an electroactive polymer) or polymer precursor (such as a monomer) onto the electrode; as needed, forming a polymer such as an electroactive polymer from the polymer precursor (e.g., by curing or a similar process); and depositing another electrically conductive layer (e.g., a second electrode) onto the electroactive polymer. In some embodiments, the method may further include repeating one or more of the above to fabricate additional layers (e.g., second electroactive element, other electrodes, alternating stack of polymer layers and electrodes, and the like. An electroactive device may have a stacked configuration.

In some embodiments, an electroactive device may be fabricated by first depositing a first electrode, and then depositing a curable material (e.g., a monomer) on the first electrode (e.g., deposited using a vapor deposition process). In some embodiments, an inlet (not shown) to a deposition chamber may open and may input an appropriate monomer initiator for starting a chemical reaction. In some embodiments, "monomer," as used herein, may refer to a monomer that forms a given polymer (i.e., as part of an electroactive element). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable material may be cured with a source of radiation (e.g., electromagnetic radiation, such as UV and/or visible light) to form an electroactive element that includes a cured elastomer material, for example by photopolymerization. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form an electroactive element. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured elastomer material may include at least one non-polymeric component in a plurality of defined regions and the method may further include removing at least a portion of the at least one non-polymeric component from the cured elastomer material to form a voided (e.g., nanovoided) polymer element.

An electrically conductive material may then be deposited onto a surface of the first electroactive element opposite a first electrode to form a second electrode. An additional curable material may be deposited onto a surface of the second electrode opposite the electroactive element. For example, the deposited additional curable material may be cured to form a second electroactive element, for example including a second cured elastomer material. In some embodiments, an additional electrically conductive material may be deposited onto a surface of the second electroactive element opposite the second electrode to form a third electrode.

In some embodiments, a deposition chamber may have an exhaust port configured to open to release at least a portion of the vapor in the chamber during and/or between one or more depositions of the materials (e.g., monomers, oligomers, monomer initiators, conductive materials, etc.). In some embodiments, a deposition chamber may be purged (e.g., with a gas or the application of a vacuum, or both) to remove a portion of the vapor (e.g., monomers, oligomers, monomer initiators, metal particles, and any resultant by-products). Thereafter, one or more of the previous steps may be repeated (e.g., for a second electroactive element, and the like). In this way, individual layers of an electroactive device may be maintained at high purity levels.

In some embodiments, the deposition of the materials (e.g., monomers, oligomers, monomer initiators, conductive materials, etc.) of the electroactive device may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more electrodes, electroactive polymers, etc.). Frequently, volatile by-products are also produced, which may be removed by gas flow through the chamber.

In some embodiments, an electroactive device may be fabricated using an atmospheric pressure CVD (APCVD) coating formation technique (e.g., CVD at atmospheric pressure). In some embodiments, an electroactive device may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately 10-6 Pa (equivalently, approximately 10-8 torr)).

In some embodiments, an electroactive device may be fabricated using an aerosol assisted CVD (AACVD) process (e.g., a CVD in which the precursors are transported to the electroactive device) by means of a liquid/gas aerosol, which may be generated ultrasonically or with electrospray. In some embodiments, AACVD may be used with non-volatile precursors. In some embodiments, an electroactive device may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to the electroactive device as in CVD. DLICVD may be used on liquid or solid precursors, and high growth rates for the deposited materials may be reached using this technique.

In some embodiments, an electroactive device may be fabricated using a hot wall CVD process (e.g., CVD in which the deposition chamber is heated by an external power source and the electroactive device is heated by radiation from the heated wall of the deposition chamber). In another aspect, an electroactive device may be fabricated using a cold wall CVD process (e.g., a CVD in which only the electroactive device is directly heated, for example, by induction, while the walls of the chamber are maintained at room temperature).

In some embodiments, an electroactive device may be fabricated using a microwave plasma-assisted CVD (MPCVD) process, where microwaves are used to enhance chemical reaction rates of the precursors. In another aspect, an electroactive device may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the electroactive device or in depositing certain materials (e.g., organic materials and/or some polymers).

In some embodiments, an electroactive device may be fabricated using a remote plasma-enhanced CVD (RPECVD) process. In some embodiments, RPECVD may be similar to PECVD except that the electroactive device may not be directly in the plasma discharge region. In some embodiments, the removal of the electroactive device from the plasma region may allow for the reduction of processing temperatures down to room temperature.

In some embodiments, an electroactive device may be fabricated using an atomic-layer CVD (ALCVD) process. In some embodiments, ALCVD may deposit successive layers of different substances to produce layered, crystalline film coatings on the electroactive device.

In some embodiments, an electroactive device may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the electroactive device.

In some embodiments, an electroactive device may be fabricated using a hot filament CVD (HFCVD) process, which may also be referred to as catalytic CVD (cat-CVD) or initiated CVD (iCVD). In some embodiments, this process may use a hot filament to chemically decompose the source gases to form the materials of the electroactive device. Moreover, the filament temperature and temperature of portions of the electroactive device may be independently controlled, allowing colder temperatures for better adsorption rates at the electroactive device, and higher temperatures necessary for decomposition of precursors to free radicals at the filament.

In some embodiments, an electroactive device may be fabricated using a hybrid physical-chemical vapor deposition (HPCVD) process. HPCVD may involve both chemical decomposition of precursor gas and vaporization of a solid source to form the materials on the electroactive device.

In some embodiments, an electroactive device may be fabricated using metalorganic chemical vapor deposition (MOCVD) process (e.g., a CVD that uses metalorganic precursors) to form materials on the electroactive device. For example, an electrode may be formed on an electroactive element using this approach.

In some embodiments, an electroactive device may be fabricated using a rapid thermal CVD (RTCVD) process. This CVD process uses heating lamps or other methods to rapidly heat the electroactive device. Heating only the electroactive device rather than the precursors or chamber walls may reduce unwanted gas-phase reactions that may lead to particle formation in the electroactive device.

In some embodiments, an electroactive device may be fabricated using a photo-initiated CVD (PICVD) process. This process may use UV light to stimulate chemical reactions in the precursor materials used to make the materials for the electroactive device. Under certain conditions, PICVD may be operated at or near atmospheric pressure.

In some embodiments, electroactive devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bis-phenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, the flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component, for example, on an electrode (e.g., a first electrode or a second electrode) of the electroactive device. Alternatively, the flowable material (e.g., solvent) may be introduced into a vaporizer to deposit (e.g., via vaporization or, in alternative embodiments, via printing) a curable material onto an electrode. In some embodiments, a flowable material (e.g., solvent) may be deposited as a separate layer either on top or below a curable material (e.g., a monomer) and the solvent and curable material may be allowed to diffuse into each other before being cured by the source of radiation to generate an electroactive polymer having nanovoids. In some embodiments, after the curable material is cured, the solvent may be allowed to evaporate before another electroactive polymer or another electrode is formed. In some embodiments, the evaporation of the solvent may be accelerated by the application of heat to the surface with a heater, which may, for example, by disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated electroactive polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers and may at least partially phase separate when condensed on the substrate.

In some embodiments, there may be multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (for example SPAN 80, available from Sigma-Aldrich Company). In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

As discussed throughout the instant disclosure, the disclosed devices, systems, and methods may provide one or more advantages over conventional devices, systems, and methods. For example, in contrast to prior devices, the electroactive devices presented herein may include electroactive elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, an electroactive device may be formed in a stacked structure having a plurality of electroactive elements that are layered with multiple electrodes, enabling the plurality of electroactive elements to be actuated in conjunction with each other in a single device that may undergo a more substantial degree of deformation (e.g., compression and/or expansion) in comparison to an electroactive device having a single electroactive element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

Embodiments of the instant disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial reality systems may be implemented in a variety of different form factors and configurations. Some artificial reality systems may be designed to work without near-eye displays (NEDs), an example of which is augmented-reality system 1200 in FIG. 12. Other artificial reality systems may include a NED that also provides visibility into the real world (e.g., augmented-reality system 1300 in FIG. 13) or that visually immerses a user in an artificial reality (e.g., virtual-reality system 1400 in FIG. 14). While some artificial reality devices may be self-contained systems, other artificial reality devices may communicate and/or coordinate with external devices to provide an artificial reality experience to a user. Examples of such external devices include handheld controllers, mobile devices, desktop computers, devices worn by a user, devices worn by one or more other users, and/or any other suitable external system.

Figure 12:
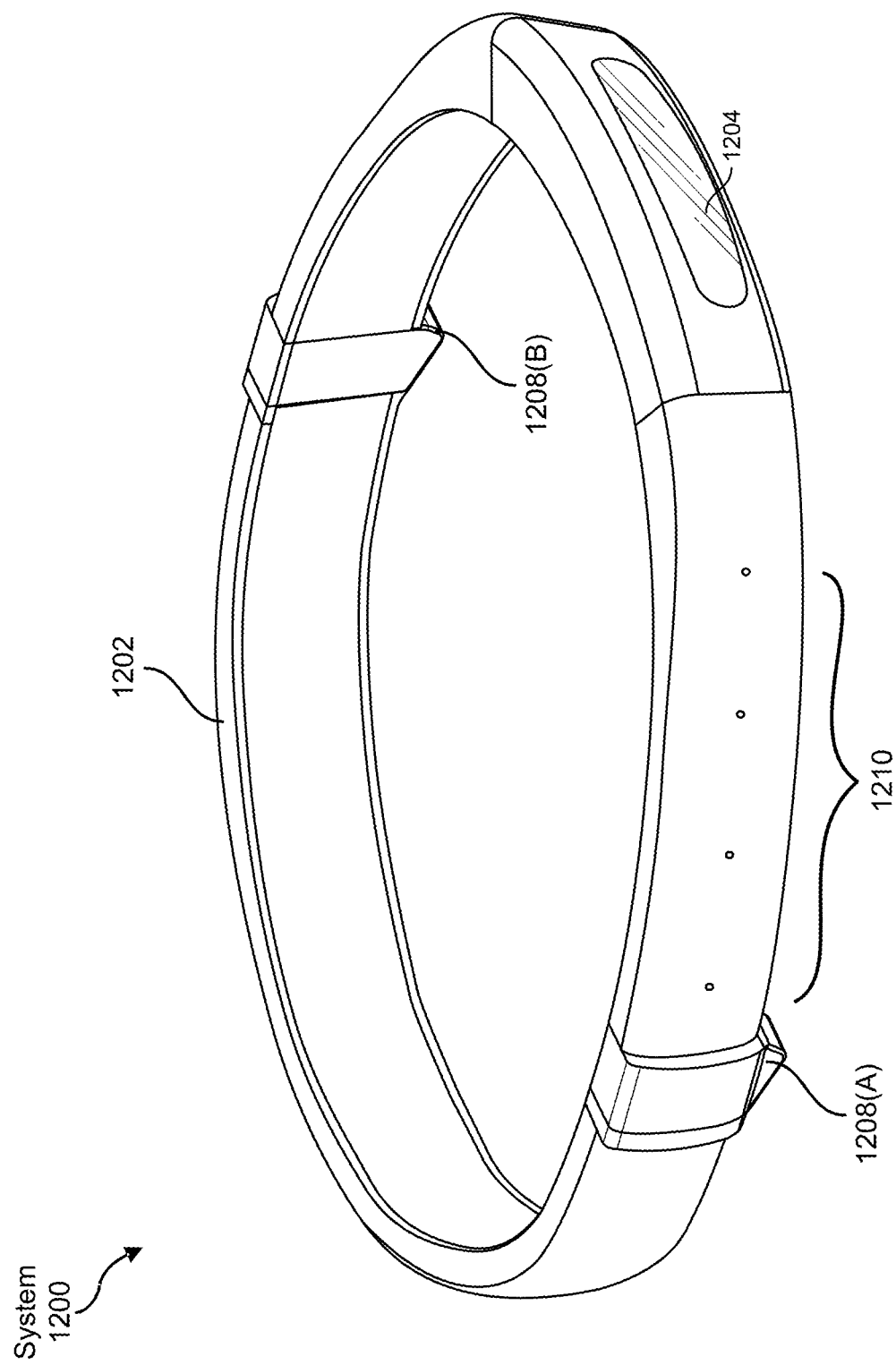
FIG. 12 shows an exemplary augmented-reality system dimensioned to fit about a body part (e.g., a head) of a user.

Turning to FIG. 12, augmented-reality system 1200 generally represents a wearable device dimensioned to fit about a body part (e.g., a head) of a user. As shown in FIG. 12, system 1200 may include a frame 1202 and a camera assembly 1204 that is coupled to frame 1202 and configured to gather information about a local environment by observing the local environment. Augmented-reality system 1200 may also include one or more audio devices, such as output audio transducers 1208(A) and 1208(B) and input audio transducers 1210. Output audio transducers 1208(A) and 1208(B) may provide audio feedback and/or content to a user, and input audio transducers 1210 may capture audio in a user's environment.

As shown, augmented-reality system 1200 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1200 may not include a NED, augmented-reality system 1200 may include other types of screens or visual feedback devices (e.g., a display screen integrated into a side of frame 1202).

Figure 13:
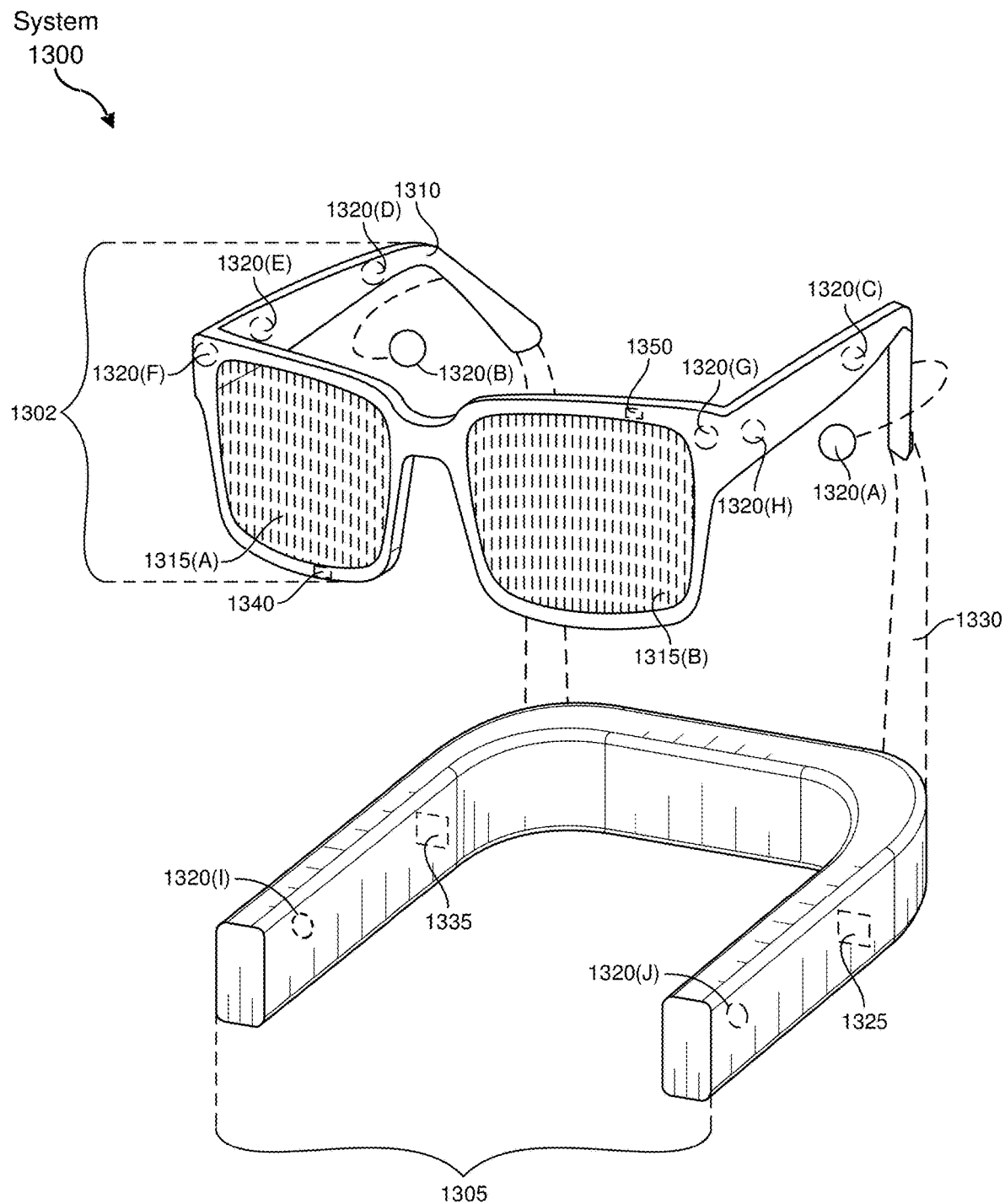
FIG. 13 shows an exemplary augmented-reality system including an eyewear device with a frame configured to hold a left display device and a right display device in front of a user's eyes.

The embodiments discussed in this disclosure may also be implemented in augmented-reality systems that include one or more NEDs. For example, as shown in FIG. 13, augmented-reality system 1300 may include an eyewear device 1302 with a frame 1310 configured to hold a left display device 1315(A) and a right display device 1315(B) in front of a user's eyes. Display devices 1315(A) and 1315(B) may act together or independently to present an image or series of images to a user. While augmented-reality system 1300 includes two displays, embodiments of this disclosure may be implemented in augmented-reality systems with a single NED or more than two NEDs.

In some embodiments, augmented-reality system 1300 may include one or more sensors, such as sensor 1340. Sensor 1340 may generate measurement signals in response to motion of augmented-reality system 1300 and may be located on substantially any portion of frame 1310. Sensor 1340 may include a position sensor, an inertial measurement unit (IMU), a depth camera assembly, or any combination thereof. In some embodiments, augmented-reality system 1300 may or may not include sensor 1340 or may include more than one sensor. In embodiments in which sensor 1340 includes an IMU, the IMU may generate calibration data based on measurement signals from sensor 1340. Examples of sensor 1340 may include, without limitation, accelerometers, gyroscopes, magnetometers, other suitable types of sensors that detect motion, sensors used for error correction of the IMU, or some combination thereof.

AR system 1300 may also include a microphone array with a plurality of acoustic sensors 1320(A)-1320(J), referred to collectively as acoustic sensors 1320. Acoustic sensors 1320 may be transducers that detect air pressure variations induced by sound waves. Each acoustic sensor 1320 may be configured to detect sound and convert the detected sound into an electronic format (e.g., an analog or digital format). The microphone array in FIG. 13 may include, for example, ten acoustic sensors: 1320(A) and 1320(B), which may be designed to be placed inside a corresponding ear of the user, acoustic sensors 1320(C), 1320(D), 1320(E), 1320(F), 1320(G), and 1320(H), which may be positioned at various locations on frame 1310, and/or acoustic sensors 1320(I) and 1320(J), which may be positioned on a corresponding neckband 1305.

The configuration of acoustic sensors 1320 of the microphone array may vary. While augmented-reality system 1300 is shown in FIG. 13 as having ten acoustic sensors 1320, the number of acoustic sensors 1320 may be greater or less than ten. In some embodiments, using higher numbers of acoustic sensors 1320 may increase the amount of audio information collected and/or the sensitivity and accuracy of the audio information. In contrast, using a lower number of acoustic sensors 1320 may decrease the computing power required by the controller 1350 to process the collected audio information. In addition, the position of each acoustic sensor 1320 of the microphone array may vary. For example, the position of an acoustic sensor 1320 may include a defined position on the user, a defined coordinate on the frame 1310, an orientation associated with each acoustic sensor, or some combination thereof.

Acoustic sensors 1320(A) and 1320(B) may be positioned on different parts of the user's ear, such as behind the pinna or within the auricle or fossa. Or, there may be additional acoustic sensors on or surrounding the ear in addition to acoustic sensors 1320 inside the ear canal. Having an acoustic sensor positioned next to an ear canal of a user may enable the microphone array to collect information on how sounds arrive at the ear canal. By positioning at least two of acoustic sensors 1320 on either side of a user's head (e.g., as binaural microphones), augmented-reality device 1300 may simulate binaural hearing and capture a 3D stereo sound field around about a user's head. In some embodiments, acoustic sensors 1320(A) and 1320(B) may be connected to augmented-reality system 1300 via a wired connection, and in other embodiments, the acoustic sensors 1320(A) and 1320(B) may be connected to augmented-reality system 1300 via a wireless connection (e.g., a Bluetooth connection). In still other embodiments, acoustic sensors 1320(A) and 1320(B) may not be used at all in conjunction with augmented-reality system 1300.

Acoustic sensors 1320 on frame 1310 may be positioned along the length of the temples, across the bridge, above or below display devices 1315(A) and 1315(B), or some combination thereof. Acoustic sensors 1320 may be oriented such that the microphone array is able to detect sounds in a wide range of directions surrounding the user wearing the augmented-reality system 1300. In some embodiments, an optimization process may be performed during manufacturing of augmented-reality system 1300 to determine relative positioning of each acoustic sensor 1320 in the microphone array.

AR system 1300 may further include or be connected to an external device (e.g., a paired device), such as neckband 1305. As shown, neckband 1305 may be coupled to eyewear device 1302 via one or more connectors 1330. Connectors 1330 may be wired or wireless connectors and may include electrical and/or non-electrical (e.g., structural) components. In some cases, eyewear device 1302 and neckband 1305 may operate independently without any wired or wireless connection between them. While FIG. 13 illustrates the components of eyewear device 1302 and neckband 1305 in example locations on eyewear device 1302 and neckband 1305, the components may be located elsewhere and/or distributed differently on eyewear device 1302 and/or neckband 1305. In some embodiments, the components of eyewear device 1302 and neckband 1305 may be located on one or more additional peripheral devices paired with eyewear device 1302, neckband 1305, or some combination thereof. Furthermore, neckband 1305 generally represents any type or form of paired device. Thus, the following discussion of neckband 1305 may also apply to various other paired devices, such as smart watches, smart phones, wrist bands, other wearable devices, handheld controllers, tablet computers, laptop computers, etc.

Pairing external devices, such as neckband 1305, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1300 may be provided by a paired device or shared between a paired device and an eyewear device, thus reducing the weight, heat profile, and form factor of the eyewear device overall while still retaining desired functionality. For example, neckband 1305 may allow components that would otherwise be included on an eyewear device to be included in neckband 1305 since users may tolerate a heavier weight load on their shoulders than they would tolerate on their heads. Neckband 1305 may also have a larger surface area over which to diffuse and disperse heat to the ambient environment. Thus, neckband 1305 may allow for greater battery and computation capacity than might otherwise have been possible on a stand-alone eyewear device. Since weight carried in neckband 1305 may be less invasive to a user than weight carried in eyewear device 1302, a user may tolerate wearing a lighter eyewear device and carrying or wearing the paired device for greater lengths of time than a user would tolerate wearing a heavy stand-alone eyewear device, thereby enabling an artificial reality environment to be incorporated more fully into a user's day-to-day activities.

Neckband 1305 may be communicatively coupled with eyewear device 1302 and/or to other devices. The other devices may provide certain functions (e.g., tracking, localizing, depth mapping, processing, storage, etc.) to augmented-reality system 1300. In the embodiment of FIG. 13, neckband 1305 may include two acoustic sensors (e.g., 1320(I) and 1320(J)) that are part of the microphone array (or potentially form their own microphone subarray). Neckband 1305 may also include a controller 1325 and a power source 1335.

Acoustic sensors 1320(I) and 1320(J) of neckband 1305 may be configured to detect sound and convert the detected sound into an electronic format (analog or digital). In the embodiment of FIG. 13, acoustic sensors 1320(I) and 1320(J) may be positioned on neckband 1305, thereby increasing the distance between the neckband acoustic sensors 1320(I) and 1320(J) and other acoustic sensors 1320 positioned on eyewear device 1302. In some cases, increasing the distance between acoustic sensors 1320 of the microphone array may improve the accuracy of beamforming performed via the microphone array. For example, if a sound is detected by acoustic sensors 1320(C) and 1320(D) and the distance between acoustic sensors 1320(C) and 1320(D) is greater than, e.g., the distance between acoustic sensors 1320(D) and 1320(E), the determined source location of the detected sound may be more accurate than if the sound had been detected by acoustic sensors 1320(D) and 1320(E).

Controller 1325 of neckband 1305 may process information generated by the sensors on neckband 1305 and/or augmented-reality system 1300. For example, controller 1325 may process information from the microphone array that describes sounds detected by the microphone array. For each detected sound, controller 1325 may perform a DoA estimation to estimate a direction from which the detected sound arrived at the microphone array. As the microphone array detects sounds, controller 1325 may populate an audio data set with the information. In embodiments in which augmented-reality system 1300 includes an inertial measurement unit, controller 1325 may compute all inertial and spatial calculations from the IMU located on eyewear device 1302. Connector 1330 may convey information between augmented-reality system 1300 and neckband 1305 and between augmented-reality system 1300 and controller 1325. The information may be in the form of optical data, electrical data, wireless data, or any other transmittable data form. Moving the processing of information generated by augmented-reality system 1300 to neckband 1305 may reduce weight and heat in eyewear device 1302, making it more comfortable to the user.

Power source 1335 in neckband 1305 may provide power to eyewear device 1302 and/or to neckband 1305. Power source 1335 may include, without limitation, lithium ion batteries, lithium-polymer batteries, primary lithium batteries, alkaline batteries, or any other form of power storage. In some cases, power source 1335 may be a wired power source. Including power source 1335 on neckband 1305 instead of on eyewear device 1302 may help better distribute the weight and heat generated by power source 1335.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1400 in FIG. 14, that mostly or completely covers a user's field of view. Virtual-reality system 1400 may include a front rigid body 1402 and a band 1404 shaped to fit around a user's head. Virtual-reality system 1400 may also include output audio transducers 1406(A) and 1406(B). Furthermore, while not shown in FIG. 14, front rigid body 1402 may include one or more electronic elements, including one or more electronic displays, one or more inertial measurement units (IMUs), one or more tracking emitters or detectors, and/or any other suitable device or system for creating an artificial reality experience.

Artificial reality systems may include a variety of types of visual feedback mechanisms. For example, display devices in augmented-reality system 1300 and/or virtual-reality system 1400 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1300 and/or virtual-reality system 1400 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1200, augmented-reality system 1300, and/or virtual system 1400 may include one or more optical sensors such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 12 and 14, output audio transducers 1208(A), 1208(B), 1406(A), and 1406(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1210 may include condenser microphones, dynamic microphones, ribbon microphones, and/or any other type or form of input transducer. In some embodiments, a single transducer may be used for both audio input and audio output.

Figure 14:
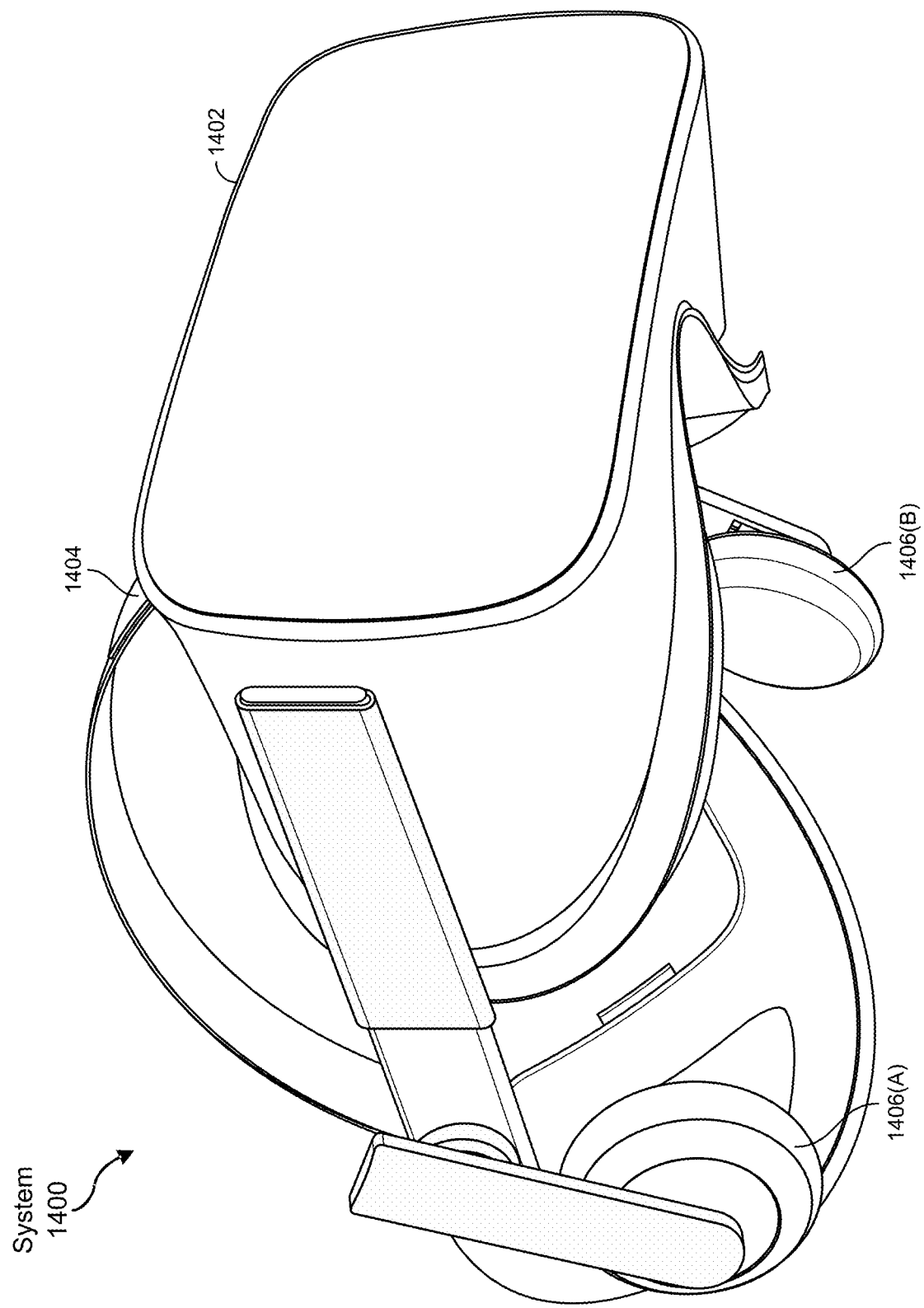
FIG. 14 shows a head-worn display system, such as a VR system, that mostly or completely covers a user's field of view.

While not shown in FIGS. 12-14, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A display device, comprising:
   an electroactive device positioned to be located at a distance from a user's eye when the display device is worn by the user, the electroactive device comprising:
     an electroactive element comprising a polymer material defining nanovoids; and
     electrodes electrically coupled to the electroactive element and configured to apply an electric field to the electroactive element, wherein the electroactive element is compressible from an uncompressed state to a compressed state by the application of the electric field so as to decrease an average size of the nanovoids and increase a density of the nanovoids in the compressed state, a magnitude of the electric field associated with a desired size and a desired density of the nanovoids between the compressed and uncompressed states; and
   an emissive device positioned to radiate image light onto an external surface of the electroactive device facing the user's eye such that the external surface of the electroactive device reflects image light toward the user's eye when the electroactive element is in the uncompressed state.

2. The display device of claim 1, wherein:
   the electroactive device is substantially opaque in the uncompressed state; and
   the electroactive device is transparent in the compressed state.

3. The display device of claim 1, wherein:
   in the uncompressed state of the electroactive element, the nanovoids have a first average size on an order of a wavelength of incident light; and
   in the compressed state of the electroactive element, the nanovoids have a second average size that is substantially smaller than the wavelength of the incident light.

4. The display device of claim 1, further comprising an eyepiece positioned between the user's eye and the electroactive device, the eyepiece configured to modify a focus of the user's eye to a focal plane of the electroactive device in an active state of the eyepiece.

5. The display device of claim 4, wherein:
   the active state of the eyepiece is used in a virtual reality application; and
   an inactive state of the eyepiece is used in an augmented reality application or a mixed reality application.

6. The display device of claim 4, wherein:
   the eyepiece is a proximate eyepiece; and the display device further comprises a distal eyepiece positioned near a surface of the electroactive device opposite the proximate eyepiece.

7. The display device of claim 1, wherein the emissive device comprises an ultra-short throw projector.

8. The display device of claim 1, wherein a degree of scattering of incident light by the electroactive element is based, at least in part, on at least one of the density or the average size of the nanovoids.

9. A display device, comprising:
an electroactive device positioned to be located at a distance from a user's eye when the display device is worn by the user, the electroactive device comprising:
an electroactive element comprising a polymer material defining nanovoids; and
electrodes electrically coupled to the electroactive element and configured to apply an electric field to the electroactive element, wherein the electroactive element is compressible from an uncompressed state to a compressed state by the application of the electric field so as to decrease an average size of the nanovoids and increase a density of the nanovoids in the compressed state, a magnitude of the electric field associated with a desired size and a desired density of the nanovoids between the compressed and uncompressed states; and
a waveguide display positioned to be located between the user's eye and the electroactive device when the display device is worn by the user, the waveguide display configured to transmit image light to the user's eye, the electroactive device positioned to at least partially obscure a view of the user of an external environment when in the uncompressed state.

10. The display device of claim 9, wherein the waveguide display is configured to operate with a light source, the light source comprising at least one of a micro light-emitting diode, a light emitting diode, an organic light-emitting diode, or a laser.

11. The display device of claim 9, wherein:
the electroactive device is substantially opaque in the uncompressed state; and
the electroactive device is transparent in the compressed state.

12. The display device of claim 9, wherein:
in the uncompressed state of the electroactive element, the nanovoids have a first average size on an order of a wavelength of incident light; and
in the compressed state of the electroactive element, the nanovoids have a second average size that is substantially smaller than the wavelength of the incident light.

13. The display device of claim 9, wherein a degree of scattering of incident light by the electroactive element is based, at least in part, on at least one of the density or the average size of the nanovoids.

14. A method, comprising:
applying an electric field to an electroactive element of an electroactive device via electrodes of the electroactive device that are electrically coupled to the electroactive element to compress the electroactive element, which comprises a polymer material defining nanovoids, from an uncompressed state to a compressed state such that an average size of the nanovoids is decreased and a density of the nanovoids is increased in the electroactive element, a magnitude of the electric field associated with a desired size and a desired density of the nanovoids between the compressed and uncompressed states, wherein the electroactive device is positioned at a distance from a user's eye; and
emitting image light from an emissive device positioned such that at least a portion of the image light is incident on an external surface of the electroactive device facing the user's eye such that the external surface of the electroactive device reflects at least a portion of the image light toward the user's eye when the electroactive device is in the uncompressed state.

15. The method of claim 14, wherein:
the electroactive device is substantially opaque in the uncompressed state; and
the electroactive device is transparent in the compressed state.

16. The method of claim 14, wherein an eyepiece is positioned between the user's eye and the electroactive device, the eyepiece configured to modify a focus of the user's eye to a focal plane of the electroactive device in an active state of the eyepiece.

17. The method of claim 16, wherein:
the eyepiece is a proximate eyepiece; and
a distal eyepiece is positioned near a surface of the electroactive device opposite the proximate eyepiece.

18. The method of claim 16, further comprising reducing the magnitude of the electric field applied to the electroactive element of an electroactive device to expand the electroactive element from the compressed state to the uncompressed state such that the average size of the nanovoids is increased and the density of the nanovoids is decreased in the electroactive element.

19. The method of claim 14, wherein the emissive device comprises at least one of an ultra-short throw projector or a waveguide display.

20. The method of claim 14, wherein a degree of scattering of incident light by the electroactive element is based, at least in part, on at least one of the density or the average size of the nanovoids.

* * * * *